(12) United States Patent
Sanga

(10) Patent No.: US 9,048,385 B2
(45) Date of Patent: Jun. 2, 2015

(54) NITRIDE SEMICONDUCTOR LIGHT EMITTING DIODE

(75) Inventor: Daisuke Sanga, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 13/380,236

(22) PCT Filed: Jun. 23, 2010

(86) PCT No.: PCT/JP2010/060628
§ 371 (c)(1),
(2), (4) Date: Feb. 28, 2012

(87) PCT Pub. No.: WO2010/150809
PCT Pub. Date: Dec. 29, 2010

(65) Prior Publication Data
US 2012/0168753 A1    Jul. 5, 2012

(30) Foreign Application Priority Data

Jun. 24, 2009  (JP) .................. 2009-149828
Jun. 24, 2009  (JP) .................. 2009-149829

(51) Int. Cl.
*H01L 33/02*   (2010.01)
*H01L 33/32*   (2010.01)
*H01L 33/12*   (2010.01)

(52) U.S. Cl.
CPC .............. *H01L 33/32* (2013.01); *H01L 33/02* (2013.01); *H01L 33/12* (2013.01)

(58) Field of Classification Search
CPC .... H01L 33/025; H01L 33/22; H01L 33/0075
USPC ................. 257/79–103, E33.001, E21.116
See application file for complete search history.

(56) References Cited

U.S. PATENT DOCUMENTS 6,015,979 A * 1/2000 Sugiura et al. .................. 257/86
6,172,382 B1   1/2001 Nagahama et al.
(Continued)

FOREIGN PATENT DOCUMENTS

| CN | 1405903 A | 3/2003 |
|----|-----------|--------|
| JP | 9-232629 A | 9/1997 |

(Continued)

OTHER PUBLICATIONS

International Search Report for PCT/JP2010/060628 dated Sep. 14, 2010.
(Continued)

*Primary Examiner* — Cheung Lee
*Assistant Examiner* — Stephen Bradley
(74) *Attorney, Agent, or Firm* — Birch, Stewart, Kolasch & Birch, LLP

(57) ABSTRACT

In a nitride semiconductor light emitting diode including a substrate made of a nitride semiconductor, a first conductive-type nitride semiconductor layer formed on the substrate, an active layer made of a nitride semiconductor, and a second conductive-type nitride semiconductor layer, characterized in that light emitted is extracted from the under surface side of the substrate or the upper surface side of the second conductive-type nitride semiconductor layer, an intermediate layer is formed between the substrate and the active layer, and dislocations is allowed to generates from the dislocation generating layer as the origin and to distribute in a light emitting region of the active layer.

34 Claims, 7 Drawing Sheets

(56) References Cited

U.S. PATENT DOCUMENTS

| | | |
|---|---|---|
| 6,645,295 B1 | 11/2003 | Koike et al. |
| 6,677,619 B1 | 1/2004 | Nagahama et al. |
| 6,790,279 B2 | 9/2004 | Koike et al. |
| 6,849,864 B2 | 2/2005 | Nagahama et al. |
| 7,211,822 B2 | 5/2007 | Nagahama et al. |
| 7,615,804 B2 | 11/2009 | Nagahama et al. |
| 7,732,236 B2 | 6/2010 | Nakahata et al. |
| 7,967,476 B2 * | 6/2011 | Hayashi et al. .......... 362/296.03 |
| 8,237,194 B2 | 8/2012 | Yoshida et al. |
| 8,362,521 B2 | 1/2013 | Nakahata et al. |
| 8,541,794 B2 | 9/2013 | Nagahama et al. |
| 8,759,837 B2 | 6/2014 | Yoshida et al. |
| 2002/0179005 A1 | 12/2002 | Koike et al. |
| 2003/0080345 A1 | 5/2003 | Motoki et al. |
| 2003/0155580 A1 | 8/2003 | Eisert et al. |
| 2003/0209185 A1 | 11/2003 | Ueno et al. |
| 2004/0004223 A1 | 1/2004 | Nagahama et al. |
| 2004/0232436 A1 | 11/2004 | Tasi et al. |
| 2005/0051791 A1 * | 3/2005 | Gotoh et al. .................... 257/99 |
| 2005/0095861 A1 | 5/2005 | Ueno et al. |
| 2005/0121679 A1 | 6/2005 | Nagahama et al. |
| 2005/0127394 A1 | 6/2005 | Nagahama et al. |
| 2007/0057282 A1 * | 3/2007 | Kinoshita et al. ............. 257/133 |
| 2007/0085093 A1 * | 4/2007 | Ohmae et al. .................... 257/89 |
| 2007/0145384 A1 * | 6/2007 | Gardner et al. ................. 257/79 |
| 2007/0164306 A1 | 7/2007 | Nakahata et al. |
| 2008/0121903 A1 * | 5/2008 | Hiramatsu et al. ............. 257/89 |
| 2008/0217645 A1 * | 9/2008 | Saxler et al. .................. 257/101 |
| 2009/0267098 A1 * | 10/2009 | Choi ............................... 257/98 |
| 2010/0025657 A1 | 2/2010 | Nagahama et al. |
| 2010/0102328 A1 | 4/2010 | Yoshida et al. |
| 2010/0171136 A1 | 7/2010 | Sakai et al. |
| 2010/0173483 A1 | 7/2010 | Ueno et al. |
| 2010/0181595 A1 | 7/2010 | Oriji et al. |
| 2010/0207138 A1 | 8/2010 | Nakahata et al. |
| 2010/0308357 A1 | 12/2010 | Horie et al. |
| 2012/0175633 A1 | 7/2012 | Yoshida et al. |

FOREIGN PATENT DOCUMENTS

| | | | |
|---|---|---|---|
| JP | 2000-21789 A | | 1/2000 |
| JP | 2000-174392 A | | 6/2000 |
| JP | 2000-323417 A | | 11/2000 |
| JP | 2001-111174 A | | 4/2001 |
| JP | 2002-261014 A | | 9/2002 |
| JP | 2003-23216 A | | 1/2003 |
| JP | 2003-86838 A | | 3/2003 |
| JP | 2003086838 A | * | 3/2003 |
| JP | 2003-258302 A | | 9/2003 |
| JP | 2003-327497 A | | 11/2003 |
| JP | 2004-63636 A | | 2/2004 |
| JP | 2006-005331 A | | 1/2006 |
| JP | 2006-24713 A | | 1/2006 |
| JP | 2006024713 A | * | 1/2006 |
| JP | 2006-54295 A | | 2/2006 |
| JP | 2006054295 A | * | 2/2006 |
| JP | 2007-67454 A | | 3/2007 |
| JP | 2007-116114 A | | 5/2007 |
| JP | 2008-078169 A | | 4/2008 |
| JP | 2008-235706 A | | 10/2008 |
| JP | 2009-135466 A | | 6/2009 |
| WO | WO 2008/143428 A1 | | 11/2008 |
| WO | WO 2008143428 A1 | * | 11/2008 |

OTHER PUBLICATIONS

International Preliminary Report on Patentability and English translation of the Written Opinion of the International Searching Authority for Application No. PCT/JP2010/060628 dated Jan. 26, 2012 (Forms PCT/IB/338, PCT/IB/373, and PCT/ISA/237).

Japanese Office Action issued in corresponding Application No. 2011-519916 on Aug. 20, 2013.

Hangleiter, A., et al., "Suppression of Nonradiative Recombination by V-Shaped Pits in GaInN/GaN Quantum Wells Produces a Large Increase in the Light Emission Efficiency", Physical Review Letters, 95, 127402, Sep. 16, 2005, pp. 127402-01 - 127402-4.

* cited by examiner

Fig. 11       PRIOR ART
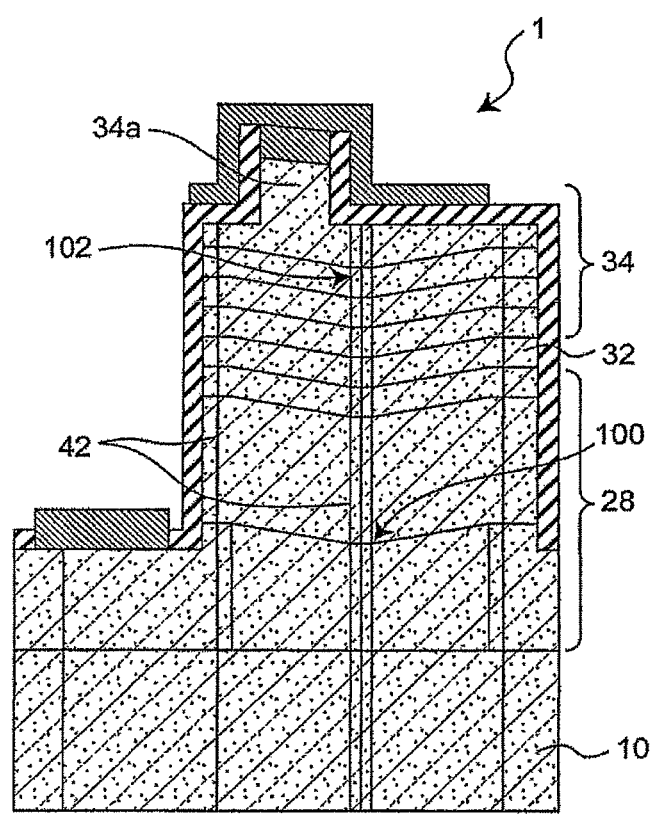

NITRIDE SEMICONDUCTOR LIGHT EMITTING DIODE

BACKGROUND OF THE INVENTION

1. Field of the Invention

The present invention relates to a nitride semiconductor light emitting diode formed on a substrate made of a nitride semiconductor ($Al_xIn_yGa_{1-x-y}N$: $0 \leq x \leq 1$, $0 \leq y \leq 1$, $0 \leq x+y \leq 1$).

2. Description of the Related Art

Nitride semiconductor light emitting elements using a nitride semiconductor, such as a laser diode and a light emitting diode enables high luminance light emission within a wide wavelength range from an ultraviolet range to a visible range, and have widely been employed in a light source for optical disk, a light source for backlight, a light source for illumination and the like.

Since a substrate made of a nitride semiconductor has hitherto been hardly available, the nitride semiconductor light emitting element has been usually manufactured by growing a nitride semiconductor layer on a different type of a substrate made of sapphire or the like. However, when the nitride semiconductor layer is grown using a different type of the substrate made of sapphire or the like, many threading dislocations are generated by lattice constant mismatch between the substrate and the nitride semiconductor. Therefore, as compared with the case of using the other compound semiconductor, density of defects such as dislocation in the semiconductor layer remarkably increases. Particularly in case of the laser diode, when the dislocation density in a semiconductor layer in a light emitting region, at which laser oscillation is obtained, is high, element lifetime drastically decreases, resulting in practically serious obstacle.

Therefore, there have been proposed various methods in which a semiconductor light emitting element is manufactured by growing a nitride semiconductor layer that has low density of defects such as dislocation and has satisfactory crystallinity.

For example, JP-A-2000-174392 discloses that a protective film is partially provided on a surface of a gallium nitride-based compound semiconductor layer grown on a sapphire substrate and a nitride semiconductor is selectively grown thereon, thereby remarkably decreasing a dislocation density in the nitride semiconductor layer, and then a second buffer layer grown at 200 to 900° C. is grown, thereby making crystallinity in the surface uniform, and a laser diode made of a nitride semiconductor having satisfactory crystallinity is formed thereon.

JP-A-2002-261014 discloses that a nitride semiconductor is grown in a large film thickness on a sapphire substrate by a halide vapor phase epitaxial method, and then removing the sapphire substrate to manufacture a nitride semiconductor substrate, and a laser diode is formed thereon.

JP-A-2003-327497 discloses that a striped or circular mask is formed on a GaAs substrate and a GaN layer is vapor-phase grown thereon, and then the GaAs substrate is removed to manufacture a GaN single crystal substrate. Next, a surface thereof is polished and heat-treated in a mixed gas atmosphere containing an $NH_3$ gas, and then a nitride semiconductor layer in which generation of dislocation is suppressed is grown on the GaN single crystal substrate to form a laser diode or a light emitting diode.

Furthermore, JP-A-2006-24713 disclosed a semiconductor laser element in which an n-type nitride semiconductor layer 28, an active layer 32 and a p-type nitride semiconductor layer 34 are grown on an n-type GaN substrate 10, as shown in FIG. 11, to form a ridge 34a on the p-type nitride semiconductor layer 34. JP-A-2006-24713 proposes that a threading dislocation density of the entire element is decreased by use of a GaN substrate 10, and a V-groove 100 parallel to a ridge stripe is formed in a semiconductor layer thereby intentionally generating dislocation 42 to provide a threading dislocation concentration region 102 where dislocations are concentrate along the V-groove 100. According to JP-A-2006-24713, when the threading dislocation concentration region 102 is provided in the active layer 32, compressive strain to be applied to the active layer 32 is relaxed and thus generation of defects caused by the compressive strain can be prevented. In this semiconductor laser element, the downward portion of the ridge 32a becomes a light emitting region. However, since the light emitting region is formed away from a threading dislocation concentration region 102, the threading dislocation density of the light emitting region is decreased by employing the GaN substrate 10.

As described above, there have hitherto been proposed various methods in which a nitride semiconductor light emitting element is formed by using a substrate made of a nitride semiconductor such as a GaN substrate. However, any method aimed at obtaining a laser diode having excellent life property by decreasing a dislocation density in a light emitting region of the laser diode. However, it is possible to expect the following advantages that are not achieved by the laser diode: when a surface emitting type light emitting diode is formed by using a substrate made of a nitride semiconductor such as a GaN substrate, not only a nitride semiconductor having satisfactory crystallinity can be employed, but also extraction efficiency of light emitted in the active layer is remarkably improved.

As shown in FIG. 10A, in a light emitting diode including a nitride semiconductor layer 35 grown on a sapphire substrate 8, since a refractive index of a sapphire substrate 8 or an electrode 36 is smaller than that of the nitride semiconductor layer 35, a structure like a wave guide in which top and bottom of the nitride semiconductor layer 35 are interposed between layers having a small refractive index is formed, and thus light emitted in the nitride semiconductor layer 35 is likely to undergo multiple reflection inside the nitride semiconductor layer 35. Light that underwent multiple reflection inside the nitride semiconductor layer 35 undergoes absorption loss due to the nitride semiconductor layer 35 per se or the electrode 36. Moreover, since the nitride semiconductor layer 35 usually has a thickness of several μm, whereas, the element dimension in a plane direction is at least several 100 μm, the number of multiple reflection inside the nitride semiconductor layer 35 drastically increases, and thus external quantum efficiency of the nitride semiconductor light emitting diode considerably decreases.

In contrast, as shown in FIG. 10B, when a light emitting diode is formed by using a substrate 10 made of a nitride semiconductor, such as GaN substrate in place of a different type of a substrate 8 such as a sapphire substrate, the refractive index of the substrate 10 approximately agrees with that of nitride semiconductor layer 35 constituting the element. Therefore, it is possible to overcome multiple reflection inside the thin nitride semiconductor layer 35 and to reduce absorption loss in the nitride semiconductor layer 35 or the electrode 36, resulting in improvement of external quantum efficiency.

Furthermore, when a substrate made of a nitride semiconductor, such as a GaN substrate is used, heat radiation efficiency can be improved because of its higher thermal conductivity than that of the sapphire substrate. Therefore, an improvement in various performances of the light emitting diode can be expected, for example, it becomes possible to control the piezoelectric field using a nonpolar/semipolar plane of the GaN substrate.

However, the present inventors have actually manufactured a light emitting diode having the same semiconductor laminated structure as that of a light emitting diode of a conventional sapphire substrate by using a substrate made of a nitride semiconductor, and found that there is a problem that electro-optical characteristics of the light emitting diode deteriorate as compared with the case of forming on the sapphire substrate, contrary to conventional expectations. For example, when a comparison is made between the light emitting diode formed on the GaN substrate and the light emitting diode formed on the sapphire substrate, although the light emitting diode formed on the GaN substrate has a small dislocation density and the semiconductor layer has satisfactory crystallinity, a forward voltage (hereinafter referred simply to "$V_f$") increased by at least about 20%, while the output decreased by at least about 30%. When using the GaN substrate, light extraction efficiency should be increased by about 5% as compared with the case of using the sapphire substrate, and a decrease in output by at least about 30% means that internal quantum efficiency decreased furthermore.

SUMMARY OF THE INVENTION

Thus, an object of the present invention is to enjoy various benefits such as an improvement in light extraction efficiency by using a substrate made of a nitride semiconductor while suppressing an increase in $V_f$ and a decrease in internal quantum efficiency in a nitride semiconductor light emitting diode using a substrate made of a nitride semiconductor such as a GaN substrate, thereby providing a light emitting diode having excellent electro-optical characteristics.

In order to achieve the above object, the nitride semiconductor light emitting diode in a first aspect of the present invention is a nitride semiconductor light emitting diode including substrate made of a nitride semiconductor, a first conductive-type nitride semiconductor layer formed on the substrate, an active layer made of a nitride semiconductor formed on the first conductive-type nitride semiconductor layer, and a second conductive-type nitride semiconductor layer formed on the active layer, characterized in that light emitted is extracted from the under surface side of the substrate or the upper surface side of the second conductive-type nitride semiconductor layer, wherein an intermediate layer (that is equal to a dislocation generating layer) is formed between the substrate and the active layer, dislocation, that proceeds upward in the first conductive-type nitride semiconductor layer, originates from the intermediate layer, and at least a part of dislocation generated in the intermediate layer reaches the active layer and is distributed in a light emitting region of the active layer.

According to the present invention, since a substrate made of a nitride semiconductor is used, a difference in a refractive index and a difference in a lattice constant between the substrate and the nitride semiconductor layer disappear, and light reflection at a substrate interface is suppressed and also quality of the nitride semiconductor layer is improved. Since an intermediate layer serving as the origin is provided between the substrate and the active layer, it is possible to suppress an increase in $V_f$ and a decrease in internal quantum efficiency by controlling the dislocation density in a light emitting region of the active layer to an appropriate range. Therefore, while enjoying benefits such as an improvement in light extraction efficiency by use of the substrate made of a nitride semiconductor, an increase in $V_f$ and a decrease in internal quantum efficiency caused by use of the substrate made of a nitride semiconductor are prevented to obtain a light emitting diode having excellent electro-optical characteristics. The reason why $V_f$ and internal quantum efficiency are remarkably improved by distributing dislocations generated in an intermediate layer in a light emitting region of an active layer is not necessarily apparent, but is considered that distribution of dislocations in the active layer in density to some degree facilitates injection of carriers.

It is preferred that dislocations generated in the intermediate layer are uniformly distributed in a light emitting region of the active layer. When dislocations has strong anisotropy, for example, dislocations are distributed in a state of being drastically biased in a plane direction or distributed in a specific orientation, $V_f$ and internal quantum efficiency in the plane of a light emitting region became un-uniform, and thus intensity distribution that is undesirable for light emitting surface may occur.

In order to suppress an increase in $V_f$ and a decrease in internal quantum efficiency, the average dislocation density in a light emitting region of the active layer is preferably more than $1\times10^8$ cm$^{-2}$. In contrast, even if a dislocation density in a light emitting region of the active layer 32 is too high, a decrease in luminous efficiency and an increase in leakage current may occur. Therefore, the dislocation density is desirably less than $5\times10^9$ cm$^{-2}$. In contrast, the average dislocation density in the substrate is preferably less than that in a light emitting region of the active layer since it is possible to improve reliability at the portion that is not in the light emitting region, such as a first conductive-type nitride semiconductor layer and to suppress generation of stress due to formation of unintended dislocation density gradient in a crystal growth direction. It is advantageous that the dislocation density of the substrate is low to some extent since the substrate per se can be manufactured at a high yield. Therefore, it is preferred that the average dislocation density is less than $1\times10^8$ cm$^{-2}$ on the lower side of the intermediate layer, and the average dislocation density is more than $1\times10^8$ cm$^{-2}$ on the upper side of the intermediate layer, in a cross section vertical to a principal surface of the substrate. According to the present invention, even in case of using the substrate 10 having low average dislocation density, the average dislocation density in a light emitting region of the active layer 30 can be controlled in a preferable range by forming an intermediate layer 30.

It is preferred that a V-shaped pit is generated in the active layer due to dislocation generated from the intermediate layer. It is considered that formation of the V pit in the active layer facilitates injection of carriers into the active layer, and thus contributing to a decrease in $V_f$ and an improvement in internal quantum efficiency.

When a shape of the intermediate layer in a cross section vertical to a principal surface of the substrate is an island shape, dislocations are easily generated from the island-shaped portion, while growing can be carried out by inheriting satisfactory crystallinity from a base in the portion other than the island-shaped portion. Therefore, it is possible to control the dislocation density in a preferable range while suppressing the generation of defects other than dislocation. The intermediate layer preferably has an island shape since it becomes difficult for a first conductive-type nitride semiconductor layer to obstruct a function such as charge injection even in case of inserting an intermediate layer into the first conductive-type nitride semiconductor layer.

The intermediate layer is preferably an amorphous or polycrystal layer since it is likely to serve as the origin of dislocation. The intermediate layer is preferably made of a nitride semiconductor containing Al, particularly AlGaN since it is easy to control the dislocation density. When the intermediate layer is made of a material having a lattice constant that is different from that of a neighboring nitride semiconductor layer, it is easy to generate dislocation.

The nitride semiconductor light emitting diode in a second aspect of the present invention is characterized by including a substrate made of a nitride semiconductor, a first conductive-type nitride semiconductor layer formed on the substrate, an active layer made of a nitride semiconductor formed on the first conductive-type nitride semiconductor layer, and a second conductive-type nitride semiconductor layer formed on the active layer, the nitride semiconductor light emitting diode extracting light emitted from the under surface side of the substrate or the upper surface side of the second conductive-type nitride semiconductor layer, wherein an intermediate layer made of an amorphous or polycrystal nitride semiconductor is formed between the substrate and the active layer, and a shape of the intermediate layer in a cross section vertical to a principal surface of the substrate is an island shape.

According to the second aspect of the present invention, when an intermediate layer made of an amorphous or polycrystal nitride semiconductor is formed between the substrate and the active layer, and the intermediate layer is grown to a thin film whose cross-sectional shape becomes an island shape in a surface emitting type nitride semiconductor light emitting diode using a substrate made of a nitride semiconductor such as a GaN substrate. Whereby, problems such as an increase in $V_f$ and a decrease in internal quantum efficiency are suppressed.

The phrase that the cross-sectional shape of the intermediate layer is an "island shape" means that a portion in which the intermediate layer has a large film thickness and a portion in which the intermediate layer has a very small film thickness or the intermediate layer does not exist alternately exist, and that the intermediate layer is not a continuous layer having a uniform film thickness, but seems to be a series of islands in the cross section vertical to a principal surface of the substrate. The cross-sectional shape of individual islands may be any shape. In the cross section vertical to a principal surface of the substrate, the intermediate layer may have an island shape, and the shape when viewed in a plane may be a dot shape or a network shape in which islands are connected to each other.

According to the present invention, while enjoying benefits such as an improvement in light extraction efficiency by use of the substrate made of a nitride semiconductor, an increase in $V_f$ and a decrease in internal quantum efficiency caused by use of the substrate made of a nitride semiconductor are prevented to obtain a light emitting diode having excellent electro-optical characteristics. The reason is considered as follows. When the cross-sectional shape of the amorphous or polycrystal intermediate layer is an island shape, it becomes easy to generate dislocations from the island-shaped portion. In contrast, since growing can be carried out by inheriting satisfactory crystallinity from a base in the portion other than the island-shaped portion, generation of defects other than dislocations is suppressed and the first conductive-type nitride semiconductor layer has satisfactory crystallinity. It is considered that distribution of dislocations thus generated in intermediate layer in a light emitting region of the active layer facilitates injection of carriers into the active layer, and thus suppressing an increase in $V_f$ and a decrease in internal quantum efficiency.

The intermediate layer may exist between a substrate and an active layer. Particularly, when the intermediate layer is formed in a first conductive-type nitride semiconductor layer, since the intermediate layer becomes closer to the active layer, it becomes easy for dislocations generated in the intermediate layer to reach a light emitting region of the active layer. It is also possible to suppress warpage from generating in the wafer since the proportion of a high dislocation density region based on the entire nitride semiconductor layer can be decreased. That is, a thermal expansion coefficient of the nitride semiconductor layer depends on the dislocation density and, as the dislocation density increased, the thermal expansion coefficient also increases. When viewed form a cross section vertical to a principal surface of the substrate, the dislocation density relatively increases in the region on the upper side of the intermediate layer, while the dislocation density relatively decreases in the region on the lower side of the intermediate layer. Therefore, when the nitride semiconductor layer is grown on a substrate made of a nitride semiconductor, warpage of the wafer is scarcely generated from the surface of the substrate to the intermediate layer since the thermal expansion coefficient is nearly the same as that of the substrate. However, wafer may cause recessed warpage in the region above the intermediate layer because of a large thermal expansion coefficient. This recessed warpage becomes severe as the proportion of the high dislocation density region in the entire nitride semiconductor layer increases. When warpage of the wafer increases, there may arise various problems that cracks are generated in the nitride semiconductor layer and wavelength distribution in the wafer surface is widen. Therefore, the total film thickness of the first conductive-type nitride semiconductor layer, the active layer and the second conductive-type nitride semiconductor layer on the lower side of the intermediate layer of the intermediate layer is preferably ⅔ or less of the total film thickness of the first conductive-type nitride semiconductor layer, the active layer and the second conductive-type nitride semiconductor layer.

Warpage of the wafer caused by a difference in a thermal expansion coefficient also depends on the grow temperature of the nitride semiconductor layer. Particularly when the active layer is made of a nitride semiconductor containing In, since In is likely to be detached at high temperature, the active layer and the second conductive-type nitride semiconductor layer to be formed thereon are grown at a temperature lower than that of the first conductive-type nitride semiconductor layer. Therefore, warpage of the wafer is more likely to be generated during growing of the first conductive-type nitride semiconductor layer that is grown at relatively high temperature. Accordingly, the position of the intermediate layer in the first conductive-type nitride semiconductor layer also becomes important. Therefore, the intermediate layer is preferably formed at the position that is closer to the active layer than the substrate in the first conductive-type nitride semiconductor layer. That is, the film thickness of the first conductive-type nitride semiconductor layer on the upper side of the intermediate layer is preferably ½ or less of the entire film thickness of the first conductive-type nitride semiconductor layer.

The average film thickness of the intermediate layer is preferably from 5 to 20 nm. When the film thickness of the intermediate layer is in this range, the amount of dislocations to be introduced becomes appropriate, and $V_f$ and internal quantum efficiency can be effectively improved. Therefore, even when inserted into the first conductive-type nitride semiconductor layer, it becomes difficult to obstruct a function such as charge injection due to the first conductive-type nitride semiconductor layer even in case of inserting into the first conductive-type nitride semiconductor layer.

In the present invention, when an intermediate layer is formed between a substrate and an active layer, it is possible to make use of various advantages such as an improvement in light extraction efficiency by use of a substrate made of a nitride semiconductor while suppressing an increase in $V_f$ and a decrease in internal quantum efficiency. As shown in FIG. 10B, when a nitride semiconductor layer 35 is grown on a substrate made of a nitride semiconductor to form a semiconductor light emitting diode, reflection loss of light, that is in question when light generated in the semiconductor layer 35 is extracted outside of a light emitting diode, mainly occurs at the interface between a rear surface (under surface) 10a of a substrate 10 and the outside (air, etc.). Therefore, it becomes possible to reduce reflection loss of light and to rapidly increase light extraction efficiency by subjecting the rear surface (under surface) 10a of the substrate 10 to various processings. For example, it is preferred to form a periodic projection or recess for varying a traveling direction of light emitted from the active layer on an under surface of the substrate. In another mode, a side surface of the substrate may be an inclined surface inwardly inclined toward the lower side from the upper side. In still another mode, a side surface and an under surface of substrate may continuously constitute a hemispheric surface. When a protective film is at least formed on an under surface of the substrate, and satisfies a relation of $t=A\lambda/(4n)$: where the symbol "t" denotes a film thickness of the protective film, "$\lambda$" denotes an emission wavelength of the active layer, "n" denotes a refractive index of the protective film in "$\lambda$", and "A" denotes a natural number, reflection loss at the rear surface of the substrate can be more reduced.

When the nitride semiconductor light emitting diode of the present invention is used in combination with a wavelength conversion member that converts a part of light emitted from the nitride semiconductor light emitting diode into light having a different wavelength, it is possible to obtain a light emitting device capable of emitting light with a desired color by color mixture of light emitted from the light emitting diode and light emitted from the wavelength conversion member.

As used herein, the term "upper" side means the side on which a semiconductor layer constituting an element is formed among two principal surfaces of a substrate of a light emitting diode, and the term "lower" side means the opposite side. As used herein, the term "light emitting region" in an active layer means the range where light to be extracted from the light emitting diode is emitted when the active layer is viewed in a plane parallel to a principal surface of the substrate. The terms "first conductive-type nitride semiconductor layer" and "second conductive-type nitride semiconductor layer" mean nitride semiconductor layers that have a conductive type of either an n-type or a p-type, and have conductive type opposite to each other. That is, when the first conductive-type nitride semiconductor layer is an n-type layer, the second conductive-type nitride semiconductor layer is a p-type layer. Alternatively, a reverse combination may be used. The "first conductive-type nitride semiconductor layer" and the "second conductive-type nitride semiconductor layer" may be composed of a plurality of layers, respectively. In that case, when a plurality of entire layers function as a predetermined conductive type, another conductive type layer may exist in a part of a plurality of layers. For example, when a first conductive-type nitride semiconductor layer of an n-type as a conductive type is composed of a plurality of layers, p-type or i-type thin layer may exist if a plurality of layers entirely act as an n-type layer.

As described above, according to the first aspect of the present invention, when an intermediate layer is formed between a substrate and an active layer and dislocations proceeding upward are generated from the intermediate layer as the origin, in a nitride semiconductor light emitting diode using a substrate made of a nitride semiconductor, whereby, dislocations are distributed in a light emitting region of active layer. Therefore, it is possible to make use of various advantages such as an improvement in light extraction efficiency by use of a substrate made of a nitride semiconductor while suppressing an increase in $V_f$ and a decrease in internal quantum efficiency, and thus a light emitting diode having excellent electro-optical characteristics can be realized.

According to the second aspect of the present invention, it is possible to suppress an increase in $V_f$ and a decrease in internal quantum efficiency by providing an intermediate layer made of an amorphous or polycrystal nitride semiconductor between a substrate and an active layer, and making the cross-sectional shape to be an island shape in a nitride semiconductor light emitting diode using a substrate made of a nitride semiconductor. Accordingly, it is possible to realize a light emitting diode having excellent electro-optical characteristics by making use of various advantages such as an improvement in light extraction efficiency by use of a substrate made of a nitride semiconductor.

BRIEF DESCRIPTION OF THE DRAWINGS

FIG. 11 is a schematic sectional view showing a nitride semiconductor light emitting laser disclosed in JP-A-2006-24713.

DETAILED DESCRIPTION OF THE INVENTION

Preferred embodiments of the present invention will be described below with dereference to the accompanying drawings. The respective drawings are schematic views, and arrangement, dimension, proportion, shape and the like illus-

First Embodiment

Figure 1:
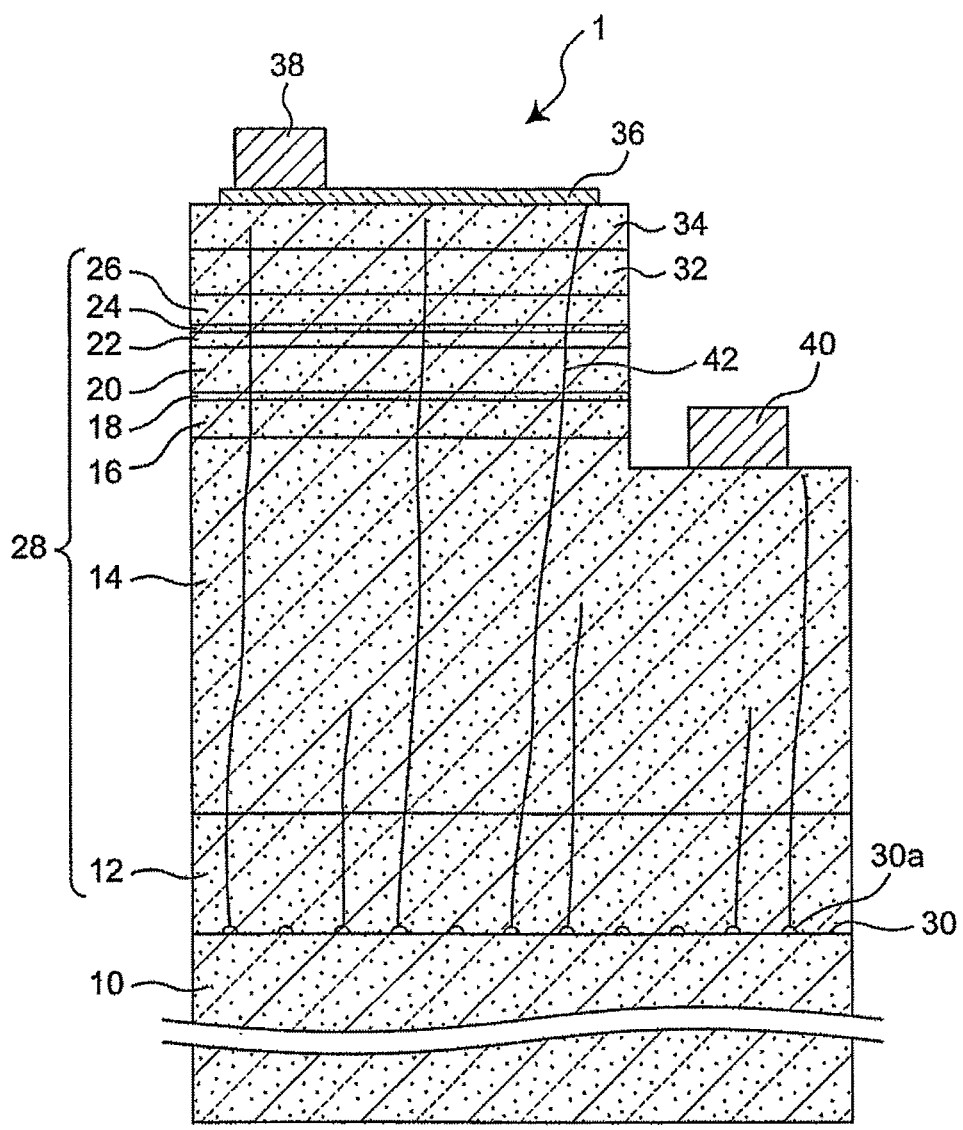
FIG. 1 is a schematic sectional view showing a nitride semiconductor light emitting diode according to the first embodiment of the present invention.

FIG. 1 is a schematic sectional view showing a nitride semiconductor light emitting diode 1 in the first embodiment of the present invention. A double heterostructure semiconductor layer composed of an n-type nitride semiconductor layer 28 (that is equal to a first conductive-type nitride semiconductor layer), an active layer 32 and a p-type nitride semiconductor layer 34 (that is equal to a second conductive-type nitride semiconductor layer) is formed on a substrate 10 made of a nitride semiconductor. An n-side electrode 40 for electrical communication with the outside is formed on a surface of the n-type nitride semiconductor layer 28 exposed by removing a part of the p-type nitride semiconductor layer 34 and the active layer 32. In order to achieve ohmic contact with the p-type nitride semiconductor layer 34, a translucent p-side electrode 36 is formed over nearly the entire surface of the p-type nitride semiconductor layer 34, and also a p-side pad electrode 38 is formed on the p-side electrode 36 while covering a part of the p-side electrode 36.

In the nitride semiconductor light emitting diode 1 of the present embodiment, an intermediate layer 30 is formed, in parallel to a principal surface of the substrate 10, over nearly the entire surface of the substrate 10 made of the nitride semiconductor, and dislocation 42, that proceeds upward originates from the intermediate layer 30. The intermediate layer 30 is made of an amorphous or polycrystal nitride semiconductor, and a cross-sectional shape is an island shape. Unlike a different type of a substrate such as a sapphire substrate, the substrate 10 made of the nitride semiconductor has a lattice constant that is not largely different from that of the n-type nitride semiconductor layer 28. For example, when the substrate 10 is made of GaN and the n-type nitride semiconductor layer 28 is also made of GaN, a difference in a lattice constant between them disappears. Therefore, the n-type nitride semiconductor layer 28 was conventionally grown directly on the substrate 10 made of the nitride semiconductor. In that case, since dislocations is not newly generated at the interface between the substrate 10 and the n-type nitride semiconductor layer 28, dislocation density in the n-type nitride semiconductor layer 28 is basically the same as that in the substrate 10, and thus a nitride semiconductor layer with low dislocation density is obtained. For example, when the dislocation density of the GaN substrate 10 can be adjusted to the value of less than $1 \times 10^8$ cm$^{-2}$, and can be reduced to the order of $10^6$ cm$^{-2}$ in case of low dislocation density, and also the n-type nitride semiconductor layer 28 has the dislocation density similar to that of the GaN substrate.

Since dislocations in the nitride semiconductor light emitting diode works as non-emission recombination center, it was generally expected that electro-optical characteristics of the light emitting diode are improved as the dislocation density of the nitride semiconductor layer decreases. However, the present inventors have found that, as the dislocation density of the nitride semiconductor layer is decreased from the order of $10^8$ cm$^{-2}$ in a light emitting diode in which the same laminated structure as that of a conventional sapphire substrate is formed on a GaN substrate, $V_f$ of the light emitting diode may increase and the output may decrease. For example, when a comparison is made between a light emitting diode that is formed on a GaN substrate and includes a nitride semiconductor layer having a dislocation density of $2 \times 10^6$ cm$^{-2}$ and a light emitting diode that is formed on a sapphire substrate and includes a nitride semiconductor layer having a dislocation density of $5 \times 10^8$ cm$^{-2}$, $V_f$ of the light emitting diode formed on the GaN substrate increased by at least about 20% and the output decreased by at least about 30%. When using the GaN substrate, light extraction efficiency should be increased by about 5% as compared with the case of using the sapphire substrate, and a decrease in output by at least about 30% means that internal quantum efficiency decreased furthermore.

Therefore, in the nitride semiconductor light emitting diode 1 of the present embodiment, dislocation 42 are distributed in the entire light emitting region of the active layer 32 by forming the intermediate layer 30 on the substrate 10 made of the nitride semiconductor and generating dislocation 42, that proceed upward from the intermediate layer 30 as the origin. Whereby, while enjoying benefits such as an improvement in light extraction efficiency by use of the substrate 10 made of a nitride semiconductor, an increase in $V_f$ and a decrease in internal quantum efficiency caused by use of the substrate 10 made of a nitride semiconductor are prevented to obtain a light emitting diode having excellent electro-optical characteristics. The reason why $V_f$ and internal quantum efficiency are remarkably improved by distributing dislocation 42 generated in the intermediate layer 30 in a light emitting region of the active layer 30 is not necessarily apparent, but is considered that distribution of dislocation 42 in the active layer in density to some degree facilitates injection of carriers.

Figure 2:
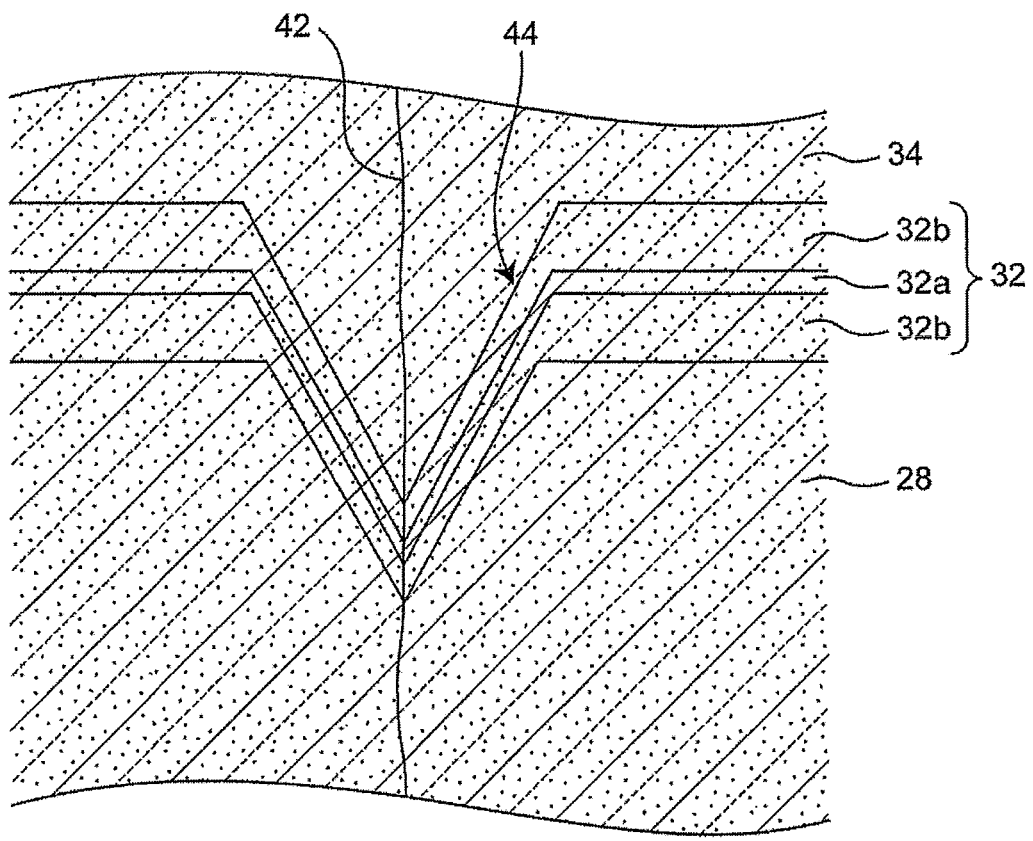
FIG. 2 is a schematic sectional view showing a V pit generated in an active layer.

For example, a V-shaped pit (hereinafter referred simply to as a "V pit") is formed in the active layer due to dislocations. It is considered that formation of the V pit facilitates injection of carriers into the active layer, and thus contributing to a decrease in $V_f$ and an improvement in internal quantum efficiency. The V pit means the portion where a nitride semiconductor layer is grown in an inverted hexagonal pyramid shape or corn shape around dislocation 42 as a center. The V pit generated around dislocation 42 is inherited to a layer growing upward in case of sequentially growing a nitride semiconductor layer and, as shown in FIG. 2, a V pit 44 is also formed in the active layer 32. As shown in FIG. 2, when the active layer 32 has a quantum well structure in which a well layer 32a is interposed between barrier layers 32b, the film thickness of the barrier layer 32b decreases at the portion of the V pit 44. Since the p-type nitride semiconductor layer 34 is invaginated into the active layer 32 through the V pit 44, the V pit 44 becomes like an injection port of carriers. Therefore, it is considered that formation of the V pit 44 facilitates injection of carriers into the active layer 32. In FIG. 2, only one well layer 32 and two barrier layers 32b that sandwich the well layer are shown for the sake of clarity.

It is preferred that dislocation 42 originate from the intermediate layer 30 is uniformly distributed in the entire light emitting region of the active layer 32. The phrase "dislocations originate from the intermediate layer is uniformly distributed in the light emitting region of the active layer" means that neither extreme bias nor anisotropy exists in distribution of dislocations in the plane. When neither extreme bias nor anisotropy exists in distribution of dislocations, the interval between dislocations may vary slightly for the following reason. When dislocation 42 has strong anisotropy, for example, dislocations are distributed in a state of being drastically biased in a plane direction or distributed in a specific orientation, $V_f$ and internal quantum efficiency in the plane of a light emitting region became un-uniform, and thus intensity distribution that is undesirable for light emitting surface may occur.

Dislocation 42 generated from the intermediate layer 30 as the origin proceeds upward and reaches the active layer 32 and, as a result, the average dislocation density in a light emitting region of the active layer 32 increases as compared with the dislocation density in the substrate 10. It is desired that the average dislocation density in a light emitting region of the active layer 32 is $1\times10^8$ cm$^{-2}$, more preferably $2\times10^8$ cm$^{-2}$, and still more preferably $4\times10^8$ cm$^{-2}$ or more. In contrast, when the average dislocation density in a light emitting region of the active layer 32 is too high, a decrease in luminous efficiency and an increased in leakage current may occur. Therefore, it is desired that the dislocation density is less than $5\times10^9$ cm$^{-2}$, more preferably less than $2\times10^9$ cm$^{-2}$, and still more preferably less than $1\times10^9$ cm$^{-2}$.

The average dislocation density in the substrate 10 is preferably less than that in a light emitting region of the active layer 32, and it is desired that the dislocation density in the substrate 10 is $1\times10^8$ cm$^{-2}$ or less, more preferably $5\times10^7$ cm$^{-2}$ or less, and still more preferably $1\times10^7$ cm$^{-2}$ or less. The reason why the dislocation density in the substrate 10 is preferably lower is that it is possible to improve reliability at the portion that is not in the light emitting region, such as an n-type nitride semiconductor layer and to suppress generation of stress due to formation of unintended dislocation density gradient in a crystal growth direction. It is advantageous that the dislocation density of the substrate 10 is low to some extent since the substrate 10 per se can be manufactured at a high yield.

The average dislocation density in a light emitting region of the active layer and the substrate 10 can be measured by TEM observation of a cross section. For example, the number of dislocations passing through the active layer is counted by observing using a field emission-type transmission electron microscope (JEM-2010F, manufactured by JEOL Ltd.) in a TE mode at an acceleration voltage 200 kV and magnification of about 10,000 times. Then, the obtained number of dislocations may be divided by an area of an active layer calculated based on the thickness of the sample to be observed and the width of the observation region.

Dislocation 42 originating from the intermediate layer 30 proceeds upward with the growth of a crystal, and may proceed slightly diagonally if it can reach the active layer as a result. It is not necessarily required that dislocations proceed vertically to a principal surface of the substrate. For example, dislocation 42 generated from the intermediate layer 30 as the origin proceeds nearly vertically at the portion near the intermediate layer 30, and may sometimes proceed diagonally above the intermediate layer (in such case, as shown in FIG. 1, when dislocation 42 is observed at certain cross section, dislocations can be seen as if it is cut midway). In the present invention, it is not necessary that all dislocations 42 generated from intermediate layer 30 do not reach the active layer, and considerable proportion of dislocation 42 may proceed upward to reach the active layer 32, and the dislocation density in the active layer 32 may be in an appropriate range.

Considering the present embodiment from another aspect, it can be said that an increase in $V_f$ and a decrease in internal quantum efficiency can be suppressed by forming an intermediate layer 30 made of amorphous or polycrystal nitride semiconductor between a substrate 10 made of a nitride semiconductor and an active layer 32. The improving effect of $V_f$ and internal quantum efficiency depends on the film thickness of the intermediate layer 30 and an increase in $V_f$ and a decrease in internal quantum efficiency are effectively suppressed by forming onto a thin film in which the cross-sectional shape of the intermediate layer 30 becomes an island shape. Commonly, a crystal becomes morphology in which islands exist dispersedly at the initial growth stage and, when the crystal is continuously grown, islands are connected to each other to form a flat film. Therefore, the cross-sectional shape can be changed to the island shape by controlling the film thickness of the intermediate layer 30 to become thin.

The reason why, an increase in $V_f$ and a decrease in internal quantum efficiency can be suppressed by forming an intermediate layer 30 made of an amorphous or polycrystal nitride semiconductor between a substrate 10 made of a nitride semiconductor and an active layer 32 onto a thin film whose cross-sectional shape becomes island shape, is considered as follows. As shown in FIG. 1, when the cross-sectional shape of the amorphous or polycrystal intermediate layer 30 is an island shape, it becomes easy for dislocations to generate from an island-shaped portion 30a. In the present embodiment, although the intermediate layer 30 is formed on the substrate 10 made of a nitride semiconductor, dislocation 42, that proceeds upward from the intermediate layer 30 as the origin, generates and is distributed in the entire light emitting region of the active layer 32. In contrast, since growing can be carried out by inheriting satisfactory crystallinity from a GaN substrate 10 (or a base layer having satisfactory crystallinity) as a base in the portion other than the island-shaped portion 30a, generation of defects other than dislocations is suppressed and crystallinity of n-type nitride semiconductor layer 28 becomes satisfactory. It is considered that distribution of dislocations thus generated in intermediate layer 30 in a light emitting region of the active layer 32 facilitates injection of carriers into the active layer 32, and thus suppressing an increase in $V_f$ and a decrease in internal quantum efficiency. The term "light emitting region" in the active layer means the range where light to be extracted from the light emitting diode is emitted when the active layer is view in the plane parallel to a principal surface of the substrate.

Figure 3:
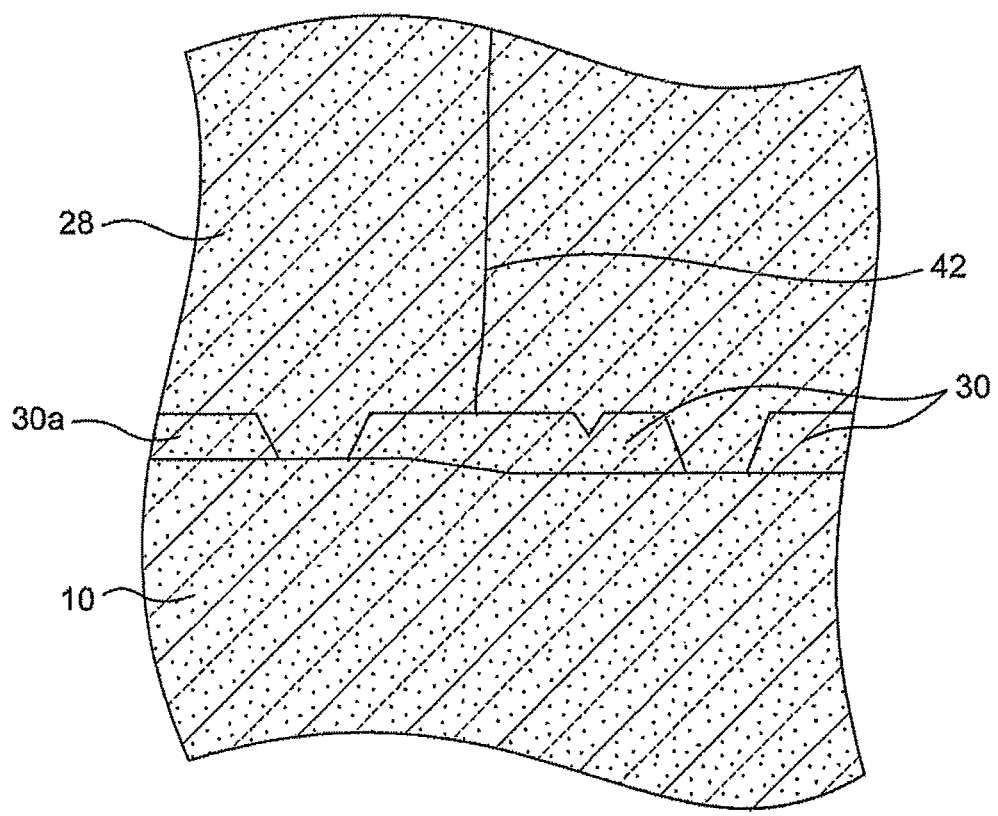
FIG. 3 is a schematic sectional view showing a state of generation of dislocations in the nitride semiconductor light emitting diode according to the first embodiment.

The amount of dislocations to be introduced by the intermediate layer 30 depends on the film thickness of the intermediate layer 30 and the amount of dislocations increases as the film thickness increases to some extent. It is not necessary that dislocations are generated from the entire island-shaped portion 30a of the intermediate layer 30. As shown in FIG. 3, dislocations are likely to be generated from the island-shaped portion 30a among the intermediate layer 30. Dislocations are generated from the portion that satisfies conditions for facilitation of generation of dislocations among the island-shaped portion 30a.

The respective components of the light emitting diode in the present embodiment will be described in detail below.
(Intermediate Layer 30)

There is no particular limitation on the composition of the intermediate layer 30, and is preferably a nitride semiconductor layer. When the intermediate layer 30 is the nitride semiconductor layer, it is preferred since unnecessary impurities may not be introduced into a laminated structure of a nitride semiconductor constituting the light emitting diode. Among the nitride semiconductor, a nitride semiconductor containing Al is preferably, more preferably $Al_xGa_{1-x}N$ ($0<x\leq1$), and still more preferably $Al_xGa_{1-x}N$ ($0<x<1$). It is preferred that the nitride semiconductor containing Al, particularly AlGaN is used as the intermediate layer 30 since it is easy to control the dislocation density. When the intermediate layer 30 is made of a material having a lattice constant different from that of the material of a neighboring nitride semiconductor layer, it is easy to generate dislocations.

It is preferred that the intermediate layer 30 is made of a nitride semiconductor grown at a low temperature of 200 to 700° C. When the intermediate layer 30 is a nitride semiconductor layer grown at low temperature, since it grows as an amorphous or polycrystal layer, the layer is likely to serve as the origin of dislocations. The fact that the intermediate layer 30 is an amorphous or polycrystal layer can be confirmed by an X-ray diffraction method or an electron diffraction method.

As shown in FIG. 3, a cross section vertical to a principal surface of the substrate of the intermediate layer 30 is preferably an island shape. Herein, the phrase that the cross-sectional shape of the intermediate layer 30 is an "island shape" means that a portion in which the intermediate layer has a large film thickness and a portion in which the intermediate layer has a very small film thickness or the intermediate layer does not exist alternately exist, and that the intermediate layer 30 is not a continuous layer having a uniform film thickness, but seems to be a series of islands in the cross section vertical to a principal surface of the substrate. The cross-sectional shape of individual islands may be any shape. In the cross section vertical to a principal surface of the substrate, the intermediate layer 30 may have an island shape, and the shape when viewed in a plane may be a dot shape or a network shape in which islands are connected to each other.

When the intermediate layer 30 has an island shape, while it becomes easy to generate dislocations from the island-shaped portion 30a, growing can be carried out by inheriting satisfactory crystallinity from a GaN substrate 10 (or a base layer having satisfactory crystallinity) as a base in the portion other than the island-shaped portion 30a. Therefore, the dislocation density can be controlled in a preferable range while suppressing generation of defects other than dislocations. It is preferred that the intermediate layer 30 has an island shape since it becomes difficult to obstruct a function such as charge injection by an n-type nitride semiconductor layer 28 even in case of inserting into the n-type nitride semiconductor layer 28. When the cross-sectional shape of the intermediate layer 30 is an island shape, it is not necessary that dislocations are generated from the entire island-shaped portion 30a. Even if dislocations are generated from only a part of the island-shaped portion 30a, the density of dislocations that reaches the active layer 32 may be in a preferable range. As shown in FIG. 3, dislocations are likely to be generated from the island-shaped portion 30a among the intermediate layer 30 and, particularly, dislocations are generated from the portion that satisfies conditions for facilitation of generation of dislocations among the island-shaped portion 30a.

When the intermediate layer 30 has an island shape, it is desired that the average outer diameter of the island is 10 nm or more, more preferably 20 nm or more, 500 nm or less, and more preferably 250 nm or less. The outer diameter of certain island is defined as a maximum outer diameter in the vicinity of the center of the height. The outer diameter of the island may vary from island to island. In that case, the average of the outer diameter may be in a preferable range. It is desired that the average height of the island is 5 nm or more, more preferably 10 nm or more, 50 nm or less, and more preferably 30 nm or less. It is desired that the average density of the island in the plane is $5 \times 10^7$ islands/$cm^{-2}$ or more, more preferably $1 \times 10^8$ islands/$cm^{-2}$ or more, $2 \times 10^{10}$ islands/$cm^{-2}$ or less, and more preferably $1 \times 10^{10}$ islands/$cm^{-2}$ or less. When the dimension and density of the island are in the above range, an increase in $V_f$ and a decrease in internal quantum efficiency can be suppressed more effectively. The average outer diameter, average height and density of the island can be measured by TEM observation of a cross section. Although the cross-sectional shape of the intermediate layer 30 has an island shape, when the planar shape is a network shape, the average outer diameter and density of the island may be considered as the average width and network density of a reticle constituting the intermediate layer 30.

In order to make the cross-sectional shape of the intermediate layer 30 to be an island shape, for example, the film thickness of the intermediate layer 30 may be controlled to very thin. Commonly, a crystal becomes morphology in which islands exist dispersedly at the initial growth stage and, when the crystal is continuously grown, islands are connected to each other to form a flat film. Therefore, the cross-sectional shape can be changed to the island shape by controlling the film thickness of the intermediate layer to become thin. It is also possible to control the dimension and density of the island-shaped portion 30a by the growing film thickness of the nitride semiconductor layer that grows as the intermediate layer 30. As the film thickness of the intermediate layer 30 increases, the dimension of the island-shaped portion 30a may increase and also the density of the island increases. It is also possible to control the amount of dislocations to be introduced by the intermediate layer 30 by the film thickness of the intermediate layer 30. The amount of dislocations also increases to some extent as the film thickness increases. It is also possible to control the amount of dislocations to be introduced by the growth temperature and composition of the intermediate layer 30, and the temperature rise process after growing of the intermediate layer 30, in addition to the film thickness of the intermediate layer 30.

It is desired that the average film thickness of the intermediate layer 30 is 5 nm or more, more preferably 7 nm or more, and still more preferably 10 nm or more. It is desired that the average film thickness of the intermediate layer 30 is 20 nm or less, more preferably 18 nm or less, and still more preferably 16 nm or less. The film thickness of the intermediate layer 30 is preferably in the above range since it does not obstruct functions such as charge injection due to the n-type nitride semiconductor layer 28 even in case of inserting into the n-type nitride semiconductor layer 28. Also, the amount of dislocations to be introduced becomes appropriate and thus $V_f$ and internal quantum efficiency can be effectively improved. The term "average film thickness" of the intermediate layer 30 means an average film thickness measured at a cross section vertical to a principal surface of the substrate. When the cross-sectional shape of the intermediate layer 30 is an island shape, it means an average film thickness of the portion where the island is present and the portion where the island is absent. When the intermediate layer 30 is vapor-phase grown, the average film thickness of the intermediate layer 30 can be controlled, for example, by the flow rate and time in case of allowing a raw gas of the intermediate layer 30 to flow.

The intermediate layer 30 may be formed between a substrate 10 and an active layer 32 so that dislocations can be introduced into the active layer 32, and there is no particular limitation on the position. Like the present embodiment, the intermediate layer 30 may be formed at the interface between the substrate 10 and the n-type nitride semiconductor layer 28, or may be allowed to exist on the way to the n-type nitride semiconductor layer 28. The intermediate layer 30 is preferably formed in at least the entire light emitting region of the active layer 32.

The intermediate layer 30 is not limited to the above-mentioned layer and may be any layer as long as it is formed in parallel to a principal surface of the substrate 10 and enables generation of dislocations in a crystal of a nitride semiconductor to be grown thereon. For example, it is possible to use, as intermediate layer 30, a layer including a fine pattern formed using oxide, high-melting point metal or the like, a semiconductor layer of a crystal type that is different from a principal crystal type of the n-type nitride semiconductor layer, a semiconductor layer having a different lattice constant and the like.

(Substrate 10)

Figure 10A:
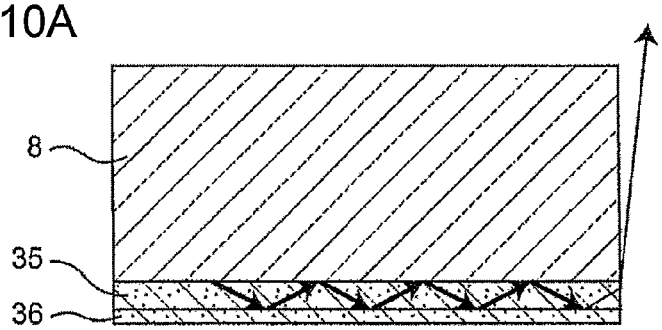
FIG. 10A is a sectional view schematically showing a path of light in a nitride semiconductor light emitting diode formed on a sapphire substrate.
Figure 10B:
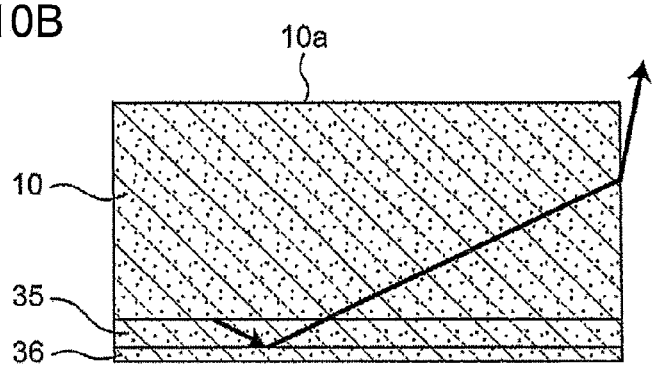
FIG. 10B is a sectional view schematically showing a path of light in a nitride semiconductor light emitting diode formed on a GaN substrate.

The substrate 10 may be any substrate as long as it is a semiconductor substrate made of a nitride semiconductor. When the substrate 10 is made of a nitride semiconductor, as described with reference to FIG. 10A and FIG. 10B, it is possible to obtain the effect of suppressing multiple reflection in a surface emitting type light emitting diode capable of extracting light from the under surface side of the substrate or the upper surface side of the semiconductor layer, and remarkably improving light extraction efficiency. As shown in FIG. 10B, when a nitride semiconductor layer 35 is grown on a substrate 10 made of a nitride semiconductor to form a semiconductor light emitting diode, reflection loss of light, that is in question when light generated in the semiconductor layer 35 is extracted outside of a light emitting diode, mainly occurs at the interface between a rear surface (under surface) 10a of a substrate 10 and the outside (air, etc.), although reflection loss of light does not occur at the interface between the semiconductor layer 35 and the substrate 10. Accordingly, it becomes possible to reduce reflection loss of light and to rapidly increase light extraction efficiency by forming unevenness on the rear surface (under surface) 10a of the substrate 10 as shown in the third to fifth embodiments, or processing the rear surface (under surface) 10a of the substrate 10 into a dome shape.

The substrate 10 made of a nitride semiconductor is particularly preferably a GaN substrate made of a gallium nitride. The GaN substrate has high thermal conductivity as compared with the sapphire substrate and therefore enables an improvement in heat radiation efficiency. Thus, an improvement in various performances of the light emitting diode can be expected, for example, it becomes possible to control the piezoelectric field using a nonpolar/semipolar plane of the GaN substrate. It is also possible for the GaN substrate to reduce not only dislocations but also various defects thereby making crystallinity satisfactory. Therefore, it is preferred so as to enhance quality of the semiconductor crystal. In order to reduce light absorption by the substrate 10 as possible, the smaller the amount of impurities of the substrate 10, the better. It is desired that the concentration of impurities of the substrate 10 is $1 \times 10^{18}$ cm$^{-3}$ or less, more preferably $5 \times 10^{17}$ cm$^{-3}$ or less, and still more preferably $1 \times 10^{17}$ cm$^{-3}$ or less.

As mentioned above, the dislocation density of the substrate 10 is preferably less than that in a light emitting region of the active layer 32. It is desired that the dislocation density in the substrate 10 is $1 \times 10^{8}$ cm$^{-2}$ or less, more preferably $5 \times 10^{7}$ cm$^{-2}$ or less, and still more preferably $1 \times 10^{7}$ cm$^{-2}$ or less. The reason why dislocation density in the substrate 10 is preferably lower is that it is possible to improve reliability at the portion other than the light emitting region, particularly an n-type nitride semiconductor layer, and suppress generation of stress by formation of unintended dislocation density gradient in a crystal growth direction. The dislocation density of the substrate 10 will be considered by the dislocation density at a principal surface on which a nitride semiconductor layer is to be grown. The dislocation density of the substrate 10 can be controlled by appropriately selecting a method of manufacturing the substrate 10.

It is possible to use, as the substrate 10, those manufactured by various methods. For example, a substrate made of a nitride semiconductor may be obtained by growing a nitride semiconductor layer as a thick film on a different type of a substrate such as a sapphire substrate by a halide vapor phase epitaxial method (HYPE method), and then removing a different type of the substrate. In case of growing the nitride semiconductor layer on a different type of the substrate such as a sapphire substrate, the dislocation density of a nitride semiconductor may be reduced using a known lateral growth method. In this case, the dislocation density in the substrate 10 does not necessarily become uniform, and the average dislocation density at a principal surface on which a nitride semiconductor layer of the substrate 10 is to be grown may be in a preferable range. Furthermore, a wafer cut out from an ingot of a nitride semiconductor crystal grown using an appropriate seed crystal may be used as the substrate 10.

(n-Type Nitride Semiconductor Layer 28)

The n-type nitride semiconductor layer 28 preferably has a structure that has a function of forming an n-side electrode 40 as a contact layer and a function of supplying electrons to an active layer 32, and a function of confining carriers or light in the active layer 32. When the n-side electrode 40 is formed on the rear surface of the substrate 10 made of a nitride semiconductor, the n-type nitride semiconductor layer 28 does not require a function as a contact layer, as a matter of course.

In the present embodiment, as shown in FIG. 1, an n-type contact layer 14 for forming an n-side electrode 40 is formed in a large thickness of 2 to 30 μm, and more preferably 5 to 15 μm. The n-type contact layer 14 is preferably doped with n-type impurities in the concentration higher than that in the other region. Preferably, it is doped with n-type impurities such as silicon in the concentration of $1 \times 10^{18}$ to $5 \times 10^{19}$ cm$^{-2}$. It is possible to diffuse current injected from the n-side electrode 40 into the plane and to supply the current to the active layer 32 by forming the n-type contact layer thus doped with n-type impurities in high concentration as a thick film. As shown in FIG. 1, when the n-type contact layer 14 is exposed by removing a part of the p-type nitride semiconductor layer 34 and the active layer 32, the n-type contact layer 14 per se is preferably a thick film so that the n-type contact layer 14 can be stably exposed even if removal depth slight varies at the time of manufacturing.

It is preferred to provide, in addition to the n-type contact layer 14 that can carry out charge supply and in-plane diffusion, an intervening layer that enables movement and supply of carriers in a lamination direction toward an active layer 32, and cladding layer that confine carriers in the active layer 32. It is also preferred to provide a low impurity concentration layer (that may be either mono-layered or multi-layered film) that contains n-type impurities in the concentration lower than in case of the n-type contact layer 14 or undoped, between the n-type contact layer 14 and the active layer 32. This layer has the action of recovering deteriorated crystallinity by the n-type contact layer 14 containing high concentration of impurities, and improving crystallinity of n-type nitride semiconductor layer and an active layer to be grown thereon. At the time of operating, in-plane diffusion of carriers can be promoted by providing a low impurity concentration layer adjacent to a high impurity concentration layer such as the n-type contact layer 14, and also an electrostatic breakdown voltage can be improved. In the present embodiment, undoped n-type nitride semiconductor layers 16, 20 and 24, and n-type nitride semiconductor layers 18 and 22 doped with n-type impurities are alternately laminated on the n-type contact layer 14 and then an n-type nitride semiconductor layer 26 having a superlattice structure is formed as a cladding layer.

The superlattice structure n-type nitride semiconductor layer 26 is preferably provided with a periodic structure in which at least two kinds of layers are alternately laminated. Specifically, it is preferred to be provided with a periodic structure of a nitride semiconductor layer containing In and a layer with the composition that is different from that of the layer. For example, when a multi-layered film having a periodic structure in which $In_xGa_{1-x}N/In_yGa_{1-y}N$ ($0 \leq x < y < 1$) is repeated is formed, crystallinity of the active layer can be improved. This effect is particularly remarkable with respect to the active layer using a nitride semiconductor layer containing In as a well layer. The multi-layered film may be provided with a composition gradient structure, in addition to a periodic structure of layers, each having different composition. In these structures, the concentration of impurities may be modulated or the film thickness may be varied. When the multi-layered film is provided with a structure in which layers, each having a film thickness of 20 nm or less, and more preferably 10 nm or less are laminated, it is advantageous for an improvement in crystallinity of the active layer.

As shown in FIG. 1, base layer 12 may be formed on the lower side of an n-type contact layer 14. This base layer 12 may be included in an action portion of an element, and is usually provided as a non-action portion that does not function as the element for the purpose of growing an element structure with satisfactory crystallinity. The base layer 12 is preferably formed in a film thickness of about 5 nm to 0.1 μm by growing at a temperature at which a single crystal is formed.

(Active Layer 32)

The active layer 32 preferably has a quantum well structure. Examples of the quantum well structure include a single quantum well structure with one well layer, and a multi-quantum well structure in which a plurality of well layers are laminated via a barrier layer interposed therebetween. In any case, the well layer serves as an emissive layer. The single quantum well structure may have a structure in which both sides of well layers are sandwiched by a barrier layer. The well layer is not limited to a quantum well structure well layer, and an emissive layer is preferably made of a nitride semiconductor containing In. When the nitride semiconductor containing In is used for the emissive layer, suitable luminous efficiency is obtained in a range from an ultraviolet range to a visible light range (red light). It is particularly preferred to use an InGaN layer as the emissive layer, and to obtain a desired emission wavelength by varying a crystal mixing ratio of In. In addition, a light emitting element capable of emitting light in an ultraviolet range may be obtained by using a nitride semiconductor having a wider band gap than that of InGaN such as GaN or AlGaN, in the emissive layer.

In the active layer 32 having a quantum well structure, a barrier layer is a layer having a wider band gap than that of a well layer. For example, it is preferred to provide InGaN, GaN and AlGaN as the barrier layer. It is desired that the film thickness of the barrier layer is 3 nm or more, more preferably 4 nm or more, 30 nm or less, and preferably 20 nm or less. The well layer is preferably thin, and the film thickness is desirably 10 nm or less. Whereby, an active layer having excellent quantum efficiency is obtained. The well layer or barrier layer may be doped with n-type or p-type impurities. One or more barrier layers may be provided between well layers. When a comparison is made in the size of a band gap between the active layer 32 having a multi-quantum well structure and other layers, the band gap of the well layer in the active layer 32 will be considered.

(p-Type Nitride Semiconductor Layer 34)

There is no particular limitation on the composition of the p-type nitride semiconductor layer 34, as long as the semiconductor is a nitride semiconductor doped with p-type impurities such as Mg. The layer is made of GaN, AlGaN with an Al ratio of 0.2 or less, or InGaN with an In ratio of 0.2 or less. More preferably, when the layer is made of GaN, it is easy to obtain preferred ohmic contact with the material of a p-side electrode 36.

(p-Side Electrode 36)

The p-side electrode 36 is made of the material that can achieve ohmic contact with the p-type nitride semiconductor layer 34, and is preferably formed over nearly the entire surface of the p-type nitride semiconductor layer 34. When emitted light is extracted from the side of the p-type nitride semiconductor layer 34, the p-side electrode 36 is preferably translucent to light emitted from the active layer 32. Examples of the material of the p-side electrode 36 include conductive oxides containing at least one kind selected from In, Zn, Sn, Ga, W and Ti, and specific examples thereof include ITO, IZO, ZnO, $In_2O_3$, $SnO_2$, $TiO_2$ and complex oxides thereof. It is also possible to use a metal thin film containing Ni and Au. In contrast, when light emitted from the under surface side of the substrate 10 is extracted, the p-side electrode 36 is preferably made of the material that reflects light emitted from the active layer 32, and Ag, Al, Rh and the like can be used. It is also possible to preferably use, as the p-side electrode 36, a reflection structure of a combination of the translucent electrode, a reflective film made of Ag, Al or Rh, a dielectric mirror and the like.

(p-Side Pad Electrode 38)

The material of a p-side pad electrode 38 is selected so that it can be connected with the p-side electrode 36 in a state of low resistance. When the p-side pad electrode 38 is provided with a laminated structure, for example, it is possible to use, as the material, any of metals of Au, Pt, Pd, Rh, Ni, W, Mo, Cr and Ti, or alloys thereof or a combination thereof. Specifically, it is possible to constitute from the side to be connected with the p-side electrode 36 using Ti/Rh/Au, W/Pt/Au, Rh/Pt/Au, W/Pt/Au/Ni, Pt/Au, Ti/Rh and the like.

(n-Side Electrode 40)

In the present embodiment, an n-type nitride semiconductor layer 28 is exposed by removing a part of a p-type nitride semiconductor layer 34 and an active layer 32, and an n-side electrode 40 is formed on the exposed n-type nitride semiconductor layer 28. In this case, the same material as that of the p-side pad electrode 38 can be used in the n-side electrode 40. That is, when the n-side electrode 40 is provided with a laminated structure, for example, it is possible to use, as the material, any of metals of Au, Pt, Pd, Rh, Ni, W, Mo, Cr and Ti, or alloys thereof or a combination thereof. Specifically, it is possible to constitute from the side to be connected with the n-type nitride semiconductor layer 28 using Ti/Rh/Au, W/Pt/Au, Rh/Pt/Au, W/Pt/Au/Ni, Pt/Au, Ti/Rh and the like. When the material of the n-side electrode 40 is the same as that of the p-side pad electrode 38, it is advantageous since n-side and p-side electrodes can be simultaneously formed.

In contrast, an n-side electrode 40 may be formed on the under surface of a substrate 10 made of a nitride semiconductor. When the n-side electrode 40 is formed on the under surface of the substrate 10, it becomes easy to apply a uniform current over the entire surface of the nitride semiconductor layer from a p-side electrode 36 toward the n-side electrode 40. In case emitted light is extracted from the side of a p-type nitride semiconductor layer 34, as shown in FIG. 1, when the n-side electrode 40 is formed at the nitride semiconductor layer side, emitted light is shielded by the n-side electrode 40, and thus extraction efficiency of emitted light decreases. Accordingly, it is possible to overcome a problem of light shielding due to the n-side electrode 40 by forming the n-side electrode 40 on the under surface of the substrate 10, resulting in an improvement of extraction efficiency of emitted light. When the n-side electrode 40 is formed on the under surface of the substrate 10, it is possible to constitute from the under surface side of the substrate 10 using a multi-layered film containing a plurality of metals, for example, Ti/Pt/Au, Ti/Pt/Au/Ni, Ti/Al, Ti/Al/Pt/Au, W/Pt/Au, V/Pt/Au, Ti/TiN/Pt/Au and Ti/TiN/Pt/Au/Ni. The n-side electrode 40 may be separately constituted by an ohmic electrode and a pad electrode.

Second Embodiment

Figure 4:
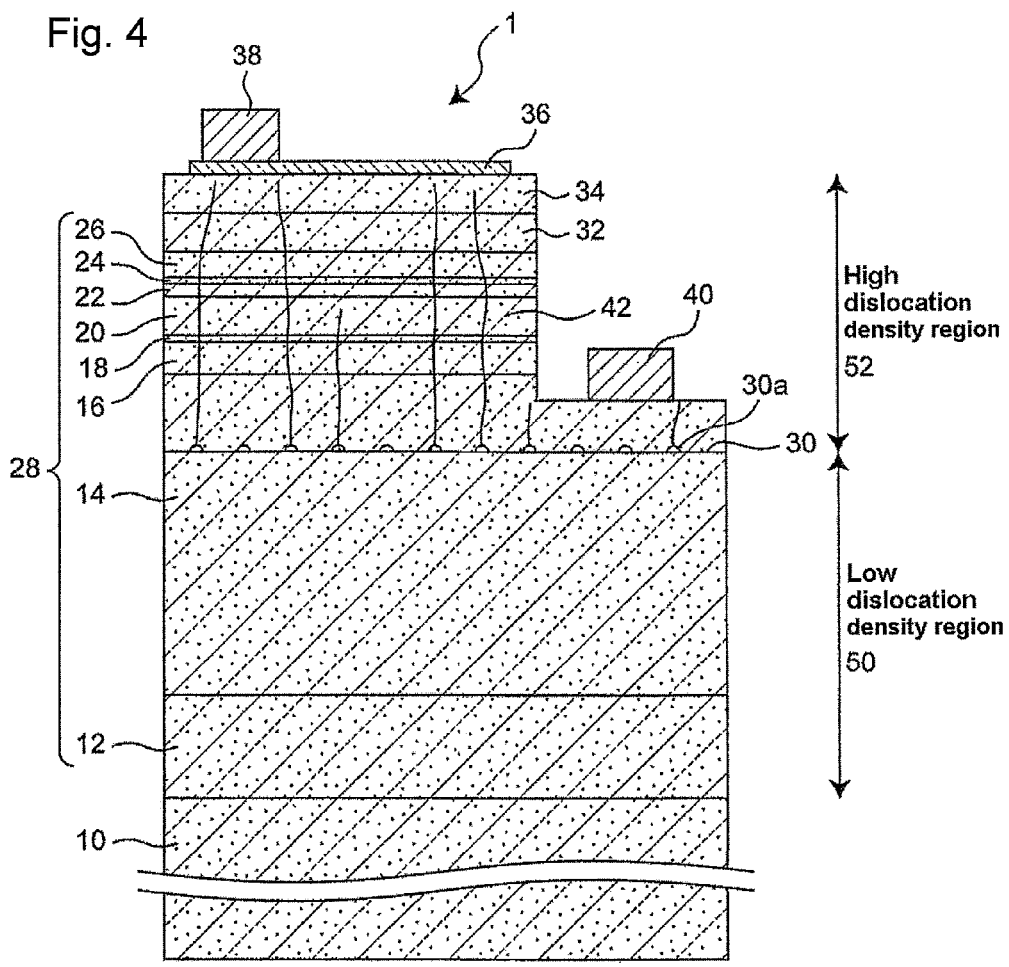
FIG. 4 is a schematic sectional view showing a nitride semiconductor light emitting diode according to the second embodiment of the present invention.

FIG. 4 is a schematic sectional view showing a nitride semiconductor light emitting diode 1 according to the second embodiment of the present invention. In the present embodiment, an intermediate layer 30 is formed in an n-type nitride semiconductor layer 28. Other points are the same as in the first embodiment.

As shown in FIG. 4, dislocations generated in the intermediate layer 30 proceed upward with the growth of a nitride semiconductor layer. Therefore, when viewed from a cross section vertical to a principal surface of a substrate 10, among the entire nitride semiconductor layers including the n-type nitride semiconductor layer 28, the active layer 32 and the p-type nitride semiconductor layer 34, the dislocation density of the region on the upper side of the intermediate layer 30 relatively increases (hereinafter referred to as a "high dislocation density region 52"), while the region on the lower side of the intermediate layer 30 relatively decreases (hereinafter referred to as a "low dislocation density region 50"). Since new dislocations are scarcely generated at the interface between the substrate 10 made of a nitride semiconductor and the n-type nitride semiconductor layer 28, the dislocation density of the low dislocation density region 50 becomes nearly the same as that in the substrate 10. Like the present embodiment, it is preferred that the intermediate layer 30 is formed in the n-type nitride semiconductor layer 28 since the proportion of the high dislocation density region 52 based on the entire nitride semiconductor layer is decreased. When the proportion of the high dislocation density region 52 is decreased, generation of warpage on the wafer can be suppressed, as mentioned below. When the intermediate layer 30 is formed in the n-type nitride semiconductor layer 28, since the intermediate layer 30 becomes close to the active layer 32, it becomes easy for dislocations generated in the intermediate layer 30 to reach in a light emitting region of the active layer 32.

Figure 5:
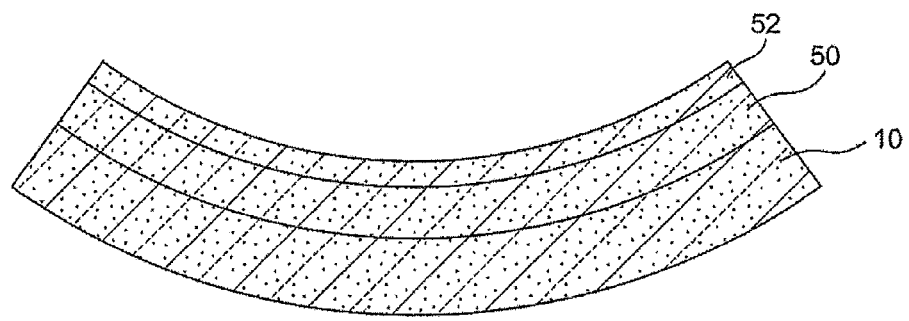
FIG. 5 is a schematic sectional view showing warpage of a wafer.

Herein, a relation between the position of the intermediate layer 30 and warpage will be described. A thermal expansion coefficient of a nitride semiconductor layer depends on dislocation density and the thermal expansion coefficient increases as the dislocation density increases. Therefore, when the nitride semiconductor layer is growing on a substrate 10 made of a nitride semiconductor, the thermal expansion coefficient is not so different from that of the substrate 10 in a range from above the substrate 10 to the intermediate layer 30, that is, in the low dislocation density region 50. Therefore, warpage of the wafer is scarcely generated. However, in the high dislocation density region 52 from above the intermediate layer 30, since the thermal expansion coefficient is large, wafer may cause recessed warpage as shown in FIG. 5. This recessed warpage becomes severe as the proportion of the high dislocation density region 52 based on the entire nitride semiconductor layer increases. When warpage of the wafer becomes severe, various problems occur, for example, cracks are generated in the nitride semiconductor layer and wavelength distribution in the wafer surface increases.

Therefore, when the intermediate layer 30 is formed in the n-type nitride semiconductor layer 28, the proportion of the high dislocation density region 52 based on the entire nitride semiconductor layer, that is, a ratio of the total film thickness of the n-type nitride semiconductor layer 28, the active layer 32 and the p-type nitride semiconductor layer 34 on the upper side of the intermediate layer 30 to the total film thickness of the n-type nitride semiconductor layer 28, the active layer 32 and the p-type nitride semiconductor layer 34 is ⅔ or less, more preferably ½ or less, still more preferably ⅓ or less. It is necessary that the thickness of the high dislocation density region 52 is a critical film thickness, where cracks are generation, or less, 4 μm or less, and more preferably 2 μm or less.

Warpage of the wafer due to a difference in a thermal expansion coefficient also depends on the grow temperature of the nitride semiconductor layer. Even if the difference in the thermal expansion coefficient is the same extent, warpage of the wafer increases as the grow temperature of the nitride semiconductor layer increases. Particularly when the active layer 32 is made of a nitride semiconductor containing In, the active layer 32 and the p-type nitride semiconductor layer 34 to be formed thereon are grown at the temperature lower than that in case of the n-type nitride semiconductor layer 28. Therefore, warpage of the wafer is more likely to be generated during growing of the n-type nitride semiconductor layer 28 that is grown at relatively high temperature. Therefore, in addition to the position of the intermediate layer 30 in the entire nitride semiconductor layer, the position of the intermediate layer 30 in the n-type nitride semiconductor layer 28 also becomes important. The intermediate layer 30 is preferably formed at the position that is closer to the active layer 32 than the substrate 10 in the n-type nitride semiconductor layer. It is desired that the intermediate layer 30 is formed at the position where the film thickness of the n-type nitride semiconductor layer 28 on the upper side of the intermediate layer 30 becomes ½ or less, more preferably ⅓ or less, and still more preferably ¼ or less of the entire film thickness of the n-type nitride semiconductor layer 28.

Even if the n-type nitride semiconductor layer 28 is made of a plurality of layers, preferred position of the intermediate layer 30 may be determined based on the above-mentioned consideration. In the present embodiment, as shown in FIG. 4, the intermediate layer 30 is formed in the most thick n-type contact layer 14 in the n-type nitride semiconductor layer 28. Inside the n-type contact layer 14, flatness of the growth surface can be once recovered while growing the remaining contact layer, and the subsequent epitaxial structure can be formed with high quality without separately providing a crystallinity recovery layer, resulting in satisfactory productivity. The intermediate layer made of a nitride semiconductor grown at low temperature, like the present embodiment, advantageously acts in current diffusion in the contact layer because of comparatively high conductivity.

In a cross section vertical to a principal surface of the substrate 10, the average dislocation density is preferably less than $1 \times 10^8$ cm$^{-2}$ in the low dislocation density region 50, that is, the lower side of the intermediate layer 30, while average dislocation density is preferably more than $1 \times 10^8$ cm$^{-2}$ in the high dislocation density region 52, that is, the upper side of the intermediate layer 30. In a plane vertical to a principal surface of the substrate 10, when the dislocation density varies depending on the position in the vertical portion, the average dislocation density in the low dislocation density region 50 may be defined right under the intermediate layer 30, while the average dislocation density in the high dislocation density region 52 may be defined right above the intermediate layer 30.

Third Embodiment

In the present embodiment, extraction efficiency of emitted light emission is enhanced by varying a traveling direction of light to form unevenness for suppressing multiple reflection on the under surface of a substrate 10 made of a nitride semiconductor. Other points are the same as in the first and second embodiments.

Figure 6:
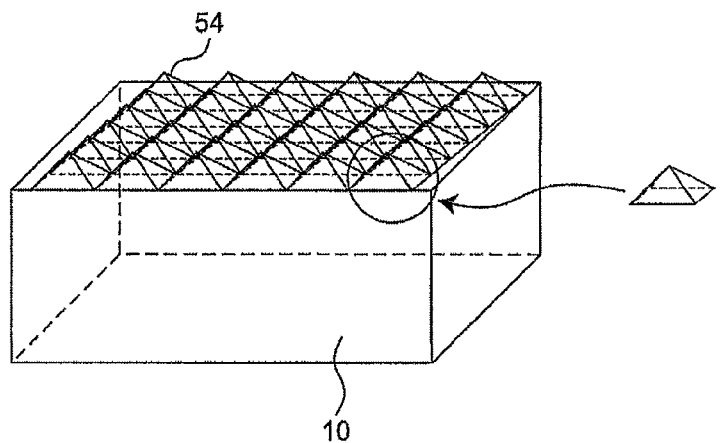
FIG. 6 is a perspective view schematically showing a substrate of a nitride semiconductor light emitting diode according to the third embodiment of the present invention.

FIG. 6 is a perspective view showing an example of unevenness to be formed on a substrate 10 in the present embodiment. For convenience' sake, only the substrate 10 is shown in the drawing by illustrating the under surface of the substrate 10 in a state of being turned upward. In the example of FIG. 6, projections 54 having a quadrangular pyramidal shape are square arrayed on the under surface of the substrate 10 in two directions (lateral and longitudinal directions). Formation of these projections 54 remarkably improves light extraction efficiency of the light emitting diode. When unevenness is formed on the under surface of the substrate 10, light is preferably extracted from the under surface of the substrate 10 by face-down mounting of the light emitting diode 1.

There is no particular limitation on the shape of the projection or recess, as long as it may be a shape capable of suppressing multiple reflection by varying a traveling direction of light. The shape free from a flat portion at tip is preferable. Examples of the shape include a pyramidal shape such as quadrangular pyramid, a conical shape, a hemispherical shape, a dome-shape (including modified hemisphere) and the like. It is desired that the external size of the projection or recess is 0.1 μm or more, more preferably 0.2 μm or more, 20 μm or less, and more preferably 10 μm or less. The external size of the projection or recess is defined by a maximum dimension in a direction parallel to a principal surface of the substrate. It is desired that the pitch of the projection or recess is 0.1 μm or more, more preferably 0.2 μm or more, 20 μm or less, and more preferably 10 μm or less. The pitch of the projection or recess is a distance between centers of the projection or recess. When the pitch varies depending on the orientation, the maximum pitch is preferably adjusted in the above range. When the dimension or pitch of the projection or recess is in the above range, light extraction efficiency can be effectively improved.

It is possible to form unevenness on the under surface of the substrate 10 using any of a dry etching method and a wet etching method. In order to obtain a shape in which the tip of the projection is free from a flat portion (curve surface, shape with a pointed tip, etc.) or a mode in which proximate ends of a projection and a neighboring projection are adjacent to each other, a wet etching method is preferable. It is possible to use, as a wet etching solution, an anisotropic etching solution such as an aqueous KOH solution, tetramethyl ammonium hydroxide (TMAH) or ethylenediamine pyrocatechol (EDP). Before etching, a pretreatment such as polishing, grinding, ashing with oxygen plasma or blasting may be carried out. The shape, dimension and pitch of the projection or recess can be controlled by selection of a wet etching solution, temperature, concentration and time of wet etching.

Fourth Embodiment

In the present embodiment, extraction efficiency of emitted light is enhanced by providing a side surface of a substrate 10 made of a nitride semiconductor and a nitride semiconductor layer (n-type nitride semiconductor layer 28, active layer 32, p-type nitride semiconductor layer 34) with an inverted mesa shape, that is, an inclined surface inclined inwardly from the upper side toward the lower side. Other points are the same as in the first and second embodiments.

Figure 7:
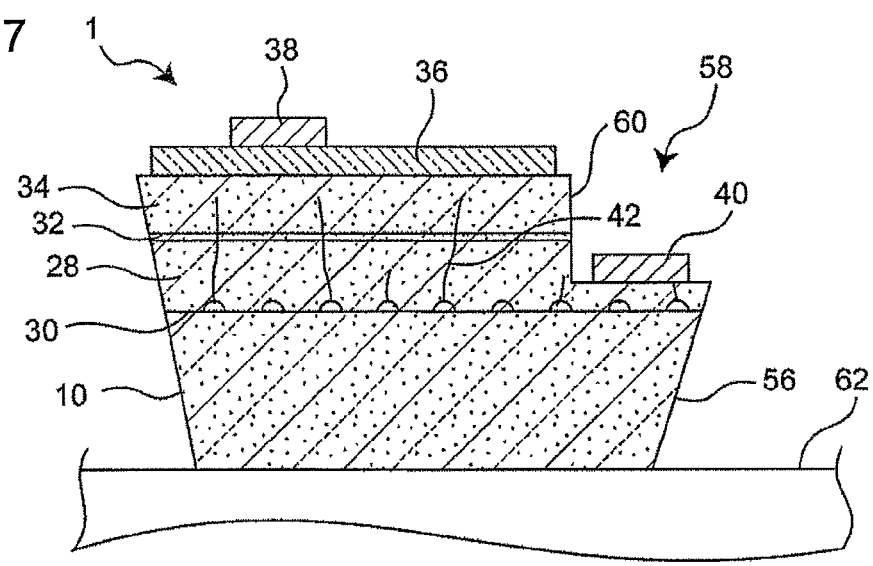
FIG. 7 is a schematic sectional view showing a nitride semiconductor light emitting diode according to the fourth embodiment of the present invention.

FIG. 7 is a schematic sectional view showing a nitride semiconductor light emitting diode 1 according to the present embodiment. As shown in FIG. 7, the side surface 56 of the substrate 10 made of a nitride semiconductor and the nitride semiconductor layer (n-type nitride semiconductor layer 28, active layer 32, p-type nitride semiconductor layer 34) is an inclined surface inclined inwardly from the upper side toward the lower side. When such an inclined surface 56 is formed as a specific crystal surface of a semiconductor that constitutes the nitride semiconductor layer and the substrate, since precision of an inclination angle of the inclined surface is regulated by a crystal structure, a stable inclined surface can be formed. The crystal surface can be formed by an etching method. When the crystal is etched, the etching rate varies depending on the crystal structure and a specific crystal surface can be formed. The specific crystal surface can be formed with particularly high precision by a wet etching method. A notch portion 58 for exposing a surface on which an n-side electrode 40 is formed is formed by reactive ion etching (RIE) or the like, and the side surface 60 is a non-inclined vertical surface.

In the light emitting diode 1 according to the present embodiment, extraction efficiency of emitted light is improved by operating as mentioned below. Herein, a description is made on the case where the light emitting diode 1 is face-up mounted and light is extracted from the p-type nitride semiconductor layer 34. When a current is applied on the light emitting diode 1, light is released from the active layer 32 in a random direction. Light rays, that are released from the active layer 32 and proceed in an upward direction as a direction of an observation surface, penetrate through a translucent p-side electrode 36 and then extracted outside. Light rays, that are released from the active layer 32 and proceed in the downward direction, are reflected on a mounting surface 62 of the light emitting diode 1 and are propagated in the nitride semiconductor light emitting diode in the lateral direction. However, light propagated in the lateral direction is reflected on an inclined surface 56 provided at the outer periphery of the light emitting diode in the upward direction (direction of the observation surface) and penetrates through the p-side electrode 36, and then extracted outside. Light, that is released from the active layer 32 in the lateral direction, or waveguided in the light emitting diode and proceeds toward the notch portion 58, reaches the side surface 60 formed generally vertically, and a part of light is emitted from the side surface 60. The remaining light is reflected and returns into the light emitting diode and, when light reaches to the outer periphery of the light emitting diode, it is reflected on the inclined surface 56 in the upward direction and then extracted outside. Extraction efficiency of emitted light is improved by allowing light propagating in the light emitting diode in the lateral direction to travel in the upward direction.

The method of forming an inclined surface 56 will be specifically described below. Herein, a description is made on the case where a GaN-based compound semiconductor layer is grown as a thick film on a sapphire substrate to obtain a nitride semiconductor substrate 10 and a GaN-based compound semiconductor layer constituting an element structure is formed thereon and then the sapphire substrate is removed to manufacture a light emitting diode. When a GaN-based compound semiconductor crystal is grown on the C-plane of the sapphire substrate by a metal organic chemical vapor deposition method (MOCVD method), it is possible to form a semiconductor crystal grown in a c-axis directing from, as an interface with a sapphire substrate, the (000-1) plane that is an N-polar surface of a semiconductor crystal. Then, the GaN-based semiconductor layer is etched by anisotropic etching such as reactive ion etching until the sapphire substrate is exposed, using an appropriate mask made of $SiO_2$ to form a side surface of a light emitting diode 1. The thus formed side surface of the light emitting diode 1 becomes a vertical surface. While remaining the mask in the former step, the light emitting diode 1 is immersed in an etching solution using a pyrophosphoric acid solution, an aqueous potassium hydroxide solution or the like, thereby wet-etching the peripheral side surface on which no mask is formed to form a crystal surface corresponding to crystallinity of the semiconductor crystal, and thus a inclined surface 56 is obtained. When the interface in contact with a sapphire substrate is formed as the (000-1) plane, that is, an N-polar surface using a GaN-based compound semiconductor as a semiconductor, since an etching rate is high at the N-polar surface, the lower side of a laminated structure is shaved inwardly as etching proceeds, and thus an inverted inclined surface 56 is formed. When etching further proceeds, the etching surface forms the {1-102} plane and 30° rotated R-plane. When etching is stopped, an inclined surface 56 composed of the {1-102} plane is formed. After etching, the mask is removed by etching with hydrofluoric acid to obtain a light emitting diode 1 as shown in FIG. 7. The thus formed side surface of the semiconductor crystal becomes the {1-102} plane (R-plane), or the plane rotated 30° around the c-axis from the plane. The {1-102} plane is a set of six planes equivalent to the (1-102) plane, and it serves as an inclined surface 56. When etching is carried out for a sufficient time, a laminated structure of the nitride semiconductor is formed into a shape of hexagonal truncated pyramid, or a shape of dodecagonal truncated pyramid including the 30° rotated R-plane, or a partial shape thereof. The inclined surface 56 belongs to the {1-102} plane or the 30° rotated R-plane of the semiconductor crystal. It is possible to form an inclined surface 56 with stable precision by regulating the inclined surface 56 through the crystal structure of the semiconductor crystal, as described above. A three dimensional shape of the semiconductor crystal with the thus formed inclined surface 56 is not limited to a shape of hexagonal truncated pyramid or dodecagonal truncated pyramid. The shape may be a shape of tetragonal truncated pyramid or truncated cone.

While the case where a light emitting diode is face-up mounted in the present embodiment, the light emitting diode may be face-down mounted. When the substrate 10 is sufficiently thick as compared with the nitride semiconductor layer, only the side surface of the substrate 10 may be formed into the inclined surface.

Fifth Embodiment

Figure 8:
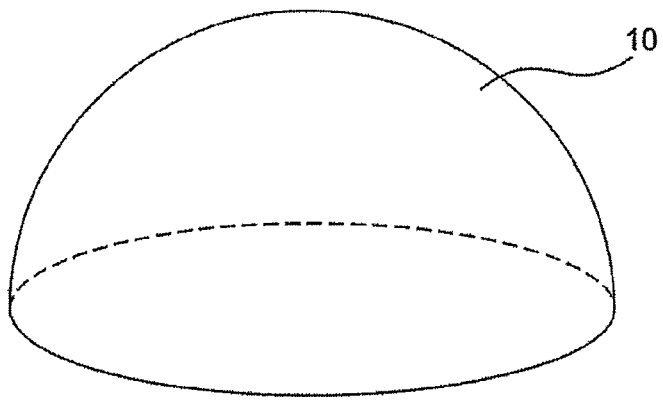
FIG. 8 is a perspective view schematically showing a substrate and a shape of a nitride semiconductor layer of a nitride semiconductor light emitting diode according to the fifth embodiment of the present invention.

In the present embodiment, as shown in FIG. 8, extraction efficiency of emitted light is improved by changing a side surface of a nitride semiconductor layer (n-type nitride semiconductor layer 28, active layer 32, p-type nitride semiconductor layer 34), the side surface of the substrate 10 and the under surface of the substrate 10 to a continuous hemispheric surface. Alternatively, a side surface and an under surface of the substrate 10 may be changed to a continuous hemispheric surface. In FIG. 8, a specific element structure is omitted for the sake of clarity. The under surface of the substrate 10 is illustrated in a state of being turned upward. Other points are the same as in the first and second embodiments. Light emitted from active layer 32 can be extracted more efficiently by employing such a shape. In order to change the side surface of the nitride semiconductor layer, the side surface of the substrate 10 and the under surface of the substrate 10 to a continuous hemispheric surface, a method such as mechanical polishing can be used.

It is preferred that an insulating translucent protective film of $SiO_2$, $Al_2O_3$, $ZrO_2$, $TiO_2$, $Si_3N_4$, $MgF_2$, $Nb_2O_5$, $Ta_2O_5$ or the like, or a conductive translucent protective film of $SnO_2$, ITO or the like are formed so as to cover the hemispheric surface, and this layer is used as an anti-reflection coating (AR coating) film. For example, it is preferred to form this layer so as to satisfy a relation of $t=A\lambda/(4n)$ ("A" is a natural number) where the symbol "t" denotes a film thickness of the protective film, "λ" denotes an emission wavelength of the active layer, and "n" denotes a refractive index of the protective film. When the protective film is formed in this film thickness, light penetration can be carried out without reflection at the interface while satisfying the conditions of anti-reflection coating to light having an emission wavelength λ. There is no particular limitation on the value A. It is more preferred that the natural number of 5 or less is selected since the film can be formed in a small film thickness and the amount of light to be absorbed decreased. The protective film may be either a mono-layered or multi-layered film. When a conductive protective film is used, the protective film is not provided continuously with the side surface of the n-type nitride semiconductor layer 28, the active layer 32, and the p-type nitride semiconductor layer 34 so as to prevent short circuit.

For example, the hemispheric surface is covered with a protective film made of $SnO_2$ and the entire light emitting diode is sealed with an epoxy resin. Since the nitride semiconductor has a refractive index of about 2, the epoxy resin has a refractive index of about 1.5, and the $SnO_2$ film has a refractive index of 1.9, the $SnO_2$ film serves as a buffer layer and can reduce reflection of light at the interface. Particularly when the film thickness t of the $SnO_2$ film is set at a thickness $t=\lambda/(4n)$, the $SnO_2$ film acts as anti-reflection coating, and thus reflection can be nearly eliminated.

Sixth Embodiment

Figure 9:
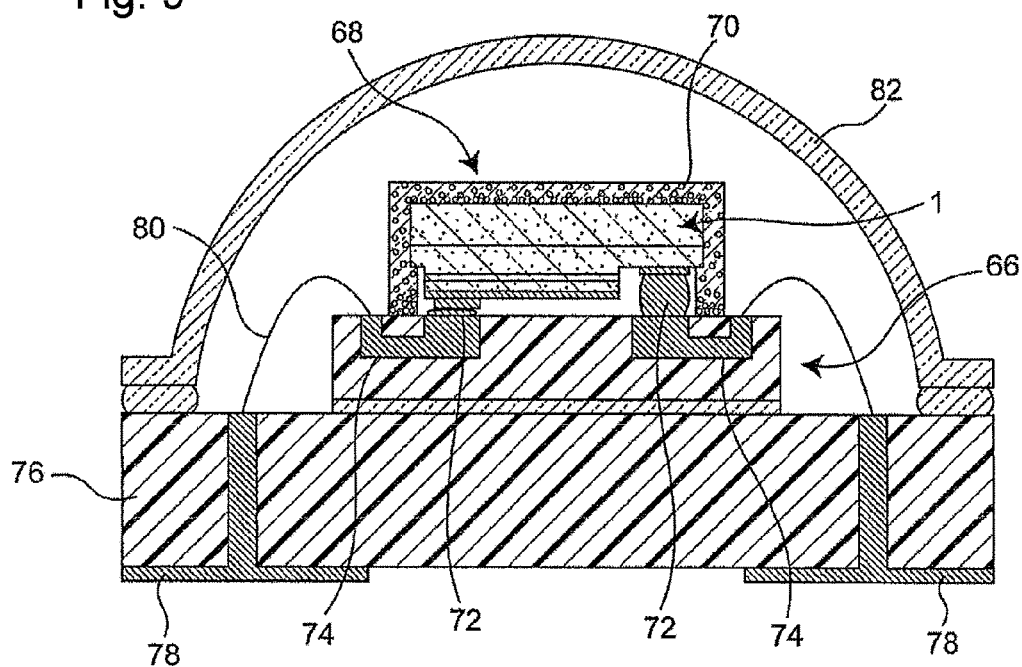
FIG. 9 is a schematic sectional view showing a nitride semiconductor light emitting diode lamp according to the sixth embodiment of the present invention.

In the present embodiment, a light emitting diode lamp (light emitting device) using the light emitting diode 1 of the first to fifth embodiments will be described. The light emitting diode 1 is mounted, for example, on a package as shown in FIG. 9 to form a light emitting diode lamp. In the example of FIG. 9, the light emitting diode 1 is face-down mounted (or flip-chip mounted) on a submount so as to extract emitted light from the under surface side of the substrate 10. In FIG. 9, the light emitting diode 1 is shown upside down as compared with FIG. 1.

In a light emitting diode lamp shown in FIG. 9, the light emitting diode 1 is face-down mounted on a submount 66, and a p-electrode and an n-electrode are connected to an electrode 74 in the submount via a solder bump 72. The light emitting diode 1 fixed on the submount 66 is coated with a sealing resin 68, and wavelength conversion members 70, that allow a part of emitted light of the light emitting diode 1 to undergo wavelength conversion, are dispersed in the sealing resin. Whereby, a light emitting diode lamp capable of emitting light with a desired color can be manufactured by additive color mixture of outgoing light from the light emitting diode 1 and light that was allowed to undergo wavelength conversion by the wavelength conversion member 70. The submount 66 is fixed to a support 76 using an appropriate adhesive and the electrode 74 of the submount is connected to the electrode 78 formed on the support 76 and a wire 80. Then, a resin lens 82 having a hollow dome shape is bonded to the support 76 so as to cover all of the submount 66, the light emitting diode 1 and the sealing resin 68.

It is possible to use, as the wavelength conversion member 70, a phosphor dispersed in the sealing resin 68. In addition, a tabular member made of a crystal per se of the phosphor may also be used as the wavelength conversion member 70. Examples of the phosphor include cadmium zinc sulfide activated with copper, YAG-based phosphor activated with cerium, LAG-based phosphor and the like. During use at high luminance for a long time, $(Re_{1-x}Sm_x)_3(Al_{1-y}Ga_y)_5O_{12}$:Ce ($0 \leq x < 1$, $0 \leq y \leq 1$, provided that Re is at least one kind of an element selected from the group consisting of Y, Gd, La, Lu and Tb) is particularly preferable. It is also possible to use a phosphor containing at least one kind selected from the group consisting of YAG, LAG, BAM, BAM:Mn, CCA, SCA, SCESN, SESN, CESN, CASBN and $CaAlSiN_3$:Eu.

While a description was made on the example in which the light emitting diode 1 is face-down mounted in the present embodiment, face-up mounting may be carried out. When the light emitting diode 1 is face-down mounted, extraction efficiency of light is more enhanced and thus a high luminance light emitting diode lamp can be produced. When face-down mounting is carried out, it is particularly useful to use the light emitting diode 1 shown in the third or fifth embodiment.

In the above-mentioned first to sixth embodiments, a description was made on the embodiment in which the n-type nitride semiconductor layer 28, the active layer 32 and the p-type nitride semiconductor layer 34 are formed in this order on the nitride semiconductor substrate 10. In contrast, there may be a structure in which the p-type nitride semiconductor layer 34, the active layer 32 and the n-type nitride semiconductor layer 28 are laminated in this order on the substrate 10. In the latter case, the p-type nitride semiconductor layer 34 will serve as the first conductive-type nitride semiconductor layer and the n-type nitride semiconductor layer 28 will serve as the second conductive-type nitride semiconductor layer. The description on a relation between the n-type nitride semiconductor layer 28 and the intermediate layer 30 of the above-mentioned embodiment may be appropriately replaced by a relation between the p-type nitride semiconductor layer 34 and the intermediate layer 30.

EXAMPLES

Example 1

The light emitting diode 1 having a structure shown in FIG. 1 was produced in the following manner.
(Substrate 10)
A GaN substrate having a dislocation density of $4 \times 10^6$ $cm^{-2}$ was used as the substrate 10. The GaN substrate 10 having the C-plane as a principal surface was set in a reaction vessel of MOVPE and the temperature of the substrate was raised to 1,140° C. Using hydrogen and nitrogen as a carrier gas, the substrate was cleaned while allowing ammonia to flow.
(Intermediate Layer 30)
Next, the temperature was decreased to 510° C. Using hydrogen and nitrogen as a carrier gas, an intermediate layer 30 made of $Al_{0.1}Ga_{0.9}N$ was grown while allowing TMG, trimethylammonium (TMA) and ammonia to flow until the estimated film thickness (that is equal to an estimated film thickness in case of a single crystal) becomes 9 nm when a uniform layer is formed.
(Base Layer 12)
The temperature was raised to 1,140° C. Using TMG and an ammonia gas as a raw gas, a base layer 12 of an undoped GaN layer was grown in a film thickness of about 1.5 μm.
(n-Type Contact Layer 14)
Similarly, using TMG and an ammonia gas as a raw gas and a silane gas as an impurity gas, an n-side contact layer 14 made of GaN doped with Si in the concentration of $5 \times 10^{18}$/$cm^3$ was grown at 1,140° C. in a film thickness of about 4.16 μm.
(First n-Type Layer 16)
A first n-type layer 16 of an undoped GaN layer was grown at 1,100° C. in a film thickness of about 145 nm by stopping only flow of a silane gas.
(Second n-Type Layer 18)
Using a silane gas, a second n-type layer 18 of an Si-doped GaN doped with Si in the concentration of $5 \times 10^{17}$/$cm^3$ was grown at 1,100° C. in a film thickness of about 10 nm.
(Third n-Type Layer 20)
A third n-type layer 20 of an undoped GaN layer was grown at 1,100° C. in a film thickness of about 145 nm by stopping only flow of a silane gas.
(Fourth n-Type Layer 22)
Using a silane gas, a fourth n-type layer 22 of an Si-doped GaN doped with Si in the concentration of $1 \times 10^{19}$/$cm^3$ was grown at 1,100° C. in a film thickness of about 30 nm.
(Fifth n-Type Layer 24)
Using TMG and ammonia, a fifth n-type layer 24 of an undoped GaN layer was grown at 1,100° C. in a film thickness of about 5 nm.

The fifth n-type layer 24 is preferably made of AlGaN with an Al ratio of 0.2 or less or InGaN with an In ratio of 0.1 or less, and more preferably GaN. The first n-type layer 16 to fifth n-type layer 24 may respectively have a different composition, preferably the same composition, and more preferably a composition of GaN. The concentration of an n-type impurity in the fifth n-type layer 24 can be adjusted to $1 \times 10^{18}$/$cm^3$ or less, preferably $5 \times 10^{17}$/$cm^3$ or less, and more preferably $1 \times 10^{17}$/$cm^3$ or less. Each range of the concentration of the n-type impurity includes undoping. It is possible to adjust the concentration of the n-type impurity of the second n-type layer 18 and the fourth n-type layer 22 to the concentration higher than the concentration of the impurity of the fifth n-type layer 24. The film thickness of the fifth n-type layer 24 can be adjusted within a range from 1 to 100 nm, preferably from 1.5 to 50 nm, more preferably from 2.5 to 15 nm, and still more preferably from 3 to 8 nm. When the film thickness of the fifth n-type layer 24 is less than 1 nm, the electrostatic breakdown voltage decreases. In contrast, when the film thickness is more than 100 nm, not only an increase in $V_f$ but also a decrease in electrostatic breakdown voltage may occur.
(Superlattice Structure n-Type Multi-Layered Film 26)
Using TMG and ammonia, an undoped GaN layer was grown in a thickness of about 3.5 nm. Subsequently, the temperature was decreased and a first nitride semiconductor layer made of undoped $In_{0.03}Ga_{0.97}N$ was grown thereon in a thickness of about 1.5 nm, using TMG, TMI and ammonia. These operations were repeated thereby alternately laminating by ten layers and, finally, an undoped GaN layer was grown in a thickness of about 3.5 nm to obtain a superlattice structure n-type multi-layered film 26.

The n-type multi-layered film layer 26 may be made of at least two kinds of nitride semiconductors, each having a different composition, and examples of preferable composition include two kind of compositions of AlGaN (including GaN) with an Al ratio of 0.1 or less and InGaN with an In ratio of 0.1 or less. There is no particular limitation on the film thickness of a single layer constituting the superlattice structure n-type multi-layered film 26, and the film thickness is 10 nm or less, preferably 7 nm or less, and more preferably 5 nm or less. Whereby, output may be improved. The single layer constituting the superlattice structure n-type multi-layered film 26 may be undoped or doped with an n-type impurity, respectively. Preferably, all layers can be undoped. While the superlattice structure n-type multi-layered film 26 was used between the fifth n-type layer 24 and the active layer 32 herein, it is also possible to provide a single layer of a thick film having a film thickness of 10 nm or more in placed of the superlattice structure n-type multi-layered film 26.

(Active Layer 32)

A barrier layer made of undoped GaN was grown in a film thickness of 20 nm. Subsequently, the temperature was controlled to 800° C. and a well layer made of undoped $In_{0.3}Ga_{0.7}N$ was grown in a film thickness of 2 nm, using TMG, TMI and ammonia. Then, five barrier layers and four well layers were alternately laminated in the order of a barrier layer, a well layer, a barrier layer, a well layer, . . . and barrier layer to obtain an active layer 32 in the total film thickness 108 nm of a multi quantum well structure.

(p-Type Nitride Semiconductor Layer 34)

Using TMG, ammonia and $Cp_2Mg$, a p-type nitride semiconductor layer 34 made of p-type GaN doped with Mg in the concentration of $1 \times 10^{20}/cm^3$ was grown at 870° C. in a film thickness of about 100 nm.

After completion of the reaction, the temperature was decreased to room temperature. Furthermore, a wafer was annealed under a nitrogen atmosphere in a reaction vessel at 700° C. thereby further decreasing the resistance of the p-type nitride semiconductor layer 34. After annealing, the wafer was taken out from the reaction vessel and a mask having a predetermined shape was formed on a surface of the p-type nitride semiconductor layer 34 as an outermost layer. Etching was carried out from the p-type nitride semiconductor layer 34 side by a reactive ion etching (RIE) device thereby exposing the surface of n-type contact layer 14 as shown in FIG. 1.

After etching, a translucent p-side electrode 36 made of ITO was formed over nearly the entire surface of the p-type nitride semiconductor layer 34 existing as the outermost layer and then a p-side pad electrode 38 for bonding made of Ti/Rh/Au was formed thereon. On the surface of the n-type contact layer 14 exposed by etching, an n-side electrode 40 made of the same member was formed by the same process as that of the p-side pad electrode 38.

Finally, the obtained laminate was cut into chips of 320 μm square to obtain a light emitting diode 1. The intermediate layer 30 in the light emitting diode 1 had an island shape with an average thickness of 15 nm. The average outer diameter and the average height of islands were respectively 120 nm and 19 nm. As a result of observation using a transmission electron microscope (TEM), dislocations, each having an a-axis vector, were generated from an island-shaped portion 30a included in the intermediate layer 30. After dislocations proceeded vertically to the substrate surface, dislocations inclined by 2 to 7 degree at the position that is about 1.7 μm away from the substrate. All dislocations were edge dislocations, each having the a-axis vector. When dislocations generated from the island-shaped portion 30a are observed in detail, two dislocations A and B arranged at an interval of 5 to 10 nm were paired. Dislocations A and B propagated in the direction <11-23> by about 10 nm along the plane {1-101}, that is a mirror symmetric with respect to the c-axis as a center, acts as a slip plane, and then propagated in the direction [0001] along the plane (1-100) as a slip plane. A step exists on a surface of the substrate 10, and dislocations were generated from the intermediate layer 30 formed thereon. The average dislocation density at the position located by only 1 μm above the intermediate layer 30 was $3.3 \times 10^9$ $cm^{-2}$. Many stacking faults existed at the island-shaped portion of the intermediate layer 30. V pits were generated at the portion where dislocations generated in the intermediate layer 30 pass through the active layer 32. The average dislocation density in the light emitting region of the active layer was $4.3 \times 10^8$ $cm^{-2}$.

The light emitting diode lamp obtained by face-up mounting of this light emitting diode 1 through wire bonding showed $V_f$ of 3.0 V and an optical output $\phi_e$ of 24.3 mW.

Comparative Example 1

In the same manner as in Example 1, except that the intermediate layer 30 was not formed, a light emitting diode lamp was produced. The obtained light emitting diode lamp showed $V_f$ of 3.7 V and an optical output $\phi_e$ of 18.3 mW.

Example 2

Using a GaN substrate (dislocation density of $2 \times 10^6$ $cm^{-2}$, thickness of 400 μm) available from a manufacturer different from that in Example 1 as a substrate 10, an intermediate layer 30 was directly formed on the substrate 10 as shown in FIG. 1 to obtain a sample A, while an intermediate layer 30 was formed via an n-type contact layer 14 as shown in FIG. 4 to obtain a sample B. In the same manner as in Example 1, except that the substrate 10 was changed and the intermediate layer 30 was grown for the time enough to obtain an estimated film thickness of 16 nm, the sample A was manufactured. In the same manner as in Example 1, except that the substrate 10 was changed and the intermediate layer 30 was formed in the following manner, the sample B was manufactured. In both cases of the samples A and B, the GaN substrate was polished to achieve the total thickness of 200 μm after epitaxial growth of a nitride semiconductor layer.

(n-Type Contact Layer 14(1))

Using TMG and an ammonia gas as a raw gas and a silane gas as an impurity gas, an n-side contact layer 14 made of GaN doped with Si in the concentration of $5 \times 10^{18}/cm^3$ was grown at 1,140° C. in a film thickness of about 3.16 μm.

(Intermediate Layer 30)

Next, the temperature was decreased to 510° C. Using hydrogen and nitrogen as a carrier gas, an intermediate layer 30 made of $Al_{0.1}Ga_{0.9}N$ was grown while allowing TMG, trimethylammonium (TMA) and ammonia to flow for the time enough to obtain an estimated film thickness of 13 nm when a uniform layer is formed.

(n-Type Contact Layer 14(2))

The temperature was raised to 1,140° C. Using TMG, and an ammonia gas as a raw gas and a silane gas as an impurity gas, an n-side contact layer 14 made of GaN with Si in the concentration of $5 \times 10^{18}/cm^3$ was regrown in a film thickness of about 1 μm.

Wavelength distribution in the wafer surface of the samples A and B was measured. As a result, wavelength distribution of the sample B was considerably improved as compared with the sample A. Specifically, a dominant wavelength was distributed in a range from 445.2 nm to 517.2 nm in the 2 inch wafer surface in the sample A, whereas, a dominant wavelength was distributed in a range from 442.1 nm to 463.7 nm in the 2 inch wafer surface in the sample B. A standard deviation of the dominant wavelength was 18.8 nm in the sample A, whereas, a standard deviation of the dominant wavelength was 4.48 nm in the sample B.

In the same manner as in Example 1, a light emitting diode 1 was manufactured using the sample B, with the above exception. A light emitting diode lamp was obtained by face-up mounting through wire bonding. As a result, $V_f$ was 2.98 V and a light output $\phi_e$ was 27.3 mW.

Example 3

In the sample B of Example 2, $SiO_2$ was formed as an insulating film on ITO as a p-side electrode 36 and a dielectric multi-layered film made of $Nb_2O_3$ and $SiO_2$ was formed thereon as a first reflective layer, and also Al was provided as a second reflective layer. Then, a p-side pad electrode 38 made of Ti/Rh was provided so as to achieve electrical communication with ITO via a through hole provided on these reflective layers. This wafer was divided into chips of 1 mm square and face-down mounting as shown in FIG. 9 was carried out. As a result, when a current value is 350 mA, $V_f$ was 3.16 V and an optical output $\phi_e$ was 548.9 mW.

Example 4

As shown in FIG. 6, projections, each having a quadrangular pyramidal shape, are arrayed in square on a rear surface of the substrate 10 of Example 3. A bottom surface of the projection has a size of 100×100 μm and a height of 50 μm. Whereby, light extraction efficiency is improved by 33% as compared with Example 3.

Example 5

In Example 3, a side surface of a GaN substrate 10 and a nitride semiconductor layer formed thereon is inclined at an angle of 30°, as shown in FIG. 7. Whereby, light extraction efficiency is improved by 51% as compared with Example 3.

Example 6

In Example 3, a GaN substrate 10 and a nitride semiconductor layer formed thereon are processed into a hemispherical shape, as shown in FIG. 8. Whereby, light extraction efficiency is improved by 70% as compared with Example 3.

Example 7

In Example 6, a GaN substrate 10 and a nitride semiconductor layer formed thereon are processed into a hemispherical shape, and then the surface is allowed to undergo anti-reflection coating of $SnO_2$ so that a film thickness t satisfies a relation: $t=\lambda/(4n)$. Whereby, light extraction efficiency is improved by 84% as compared with Example 3.

The present invention can be applied to a nitride semiconductor light emitting diode formed on a substrate made of a nitride semiconductor ($Al_xIn_yGa_{1-x-y}N$: $0 \leq x \leq 1$, $0 \leq y \leq 1$, $0 \leq x+y \leq 1$), and can be widely used as various light sources such as a light source for backlight and a light source for illumination.

BRIEF DESCRIPTION OF REFERENCE NUMERALS

1: Nitride semiconductor light emitting diode
8: Sapphire substrate
10: GaN substrate (Substrate made of nitride semiconductor)
12: Base layer
14: n-type contact layer
16: First n-type layer
18: Second n-type layer
20: Third n-type layer
22: Fourth n-type layer
24: Fifth n-type layer
26: Superlattice structure n-type multi-layered film
28: n-type nitride semiconductor layer (First conductive-type nitride semiconductor layer)
30: Intermediate layer
30a: Island-shaped portion
32: Active layer
34: p-type nitride semiconductor layer (Second conductive-type nitride semiconductor layer)
34a: Ridge portion
35: Nitride semiconductor layer
36: p-side electrode
38: p-side pad electrode
40: n-side electrode
42: Dislocation
44: V pit
46: Step
50: Low dislocation density region
52: High dislocation density region
54: Projection
56: Inclined surface
58: Notch portion
60: Vertical surface
62: Mounting surface
64: Uneven structure
64a: Projection
64b: Recess
66: Submount
68: Sealing resin
70: Wavelength conversion member
72: Solder bump
74: Electrode
76: Support
78: Electrode
80: Wire
82: Resin lens

What is claimed is:

1. A nitride semiconductor light emitting diode comprising:
a substrate made of a nitride semiconductor,
a first conductive-type nitride semiconductor layer formed on said substrate,
an active layer made of a nitride semiconductor formed on said first conductive-type nitride semiconductor layer,
a second conductive-type nitride semiconductor layer formed on said active layer,
a second conductive-type electrode formed on said second conductive-type nitride semiconductor layer, and
a second conductive-type pad electrode formed on a part of said second conductive-type electrode,
wherein light is extracted from the under surface side of said substrate or from the upper surface side of said second conductive-type nitride semiconductor layer, and
wherein an intermediate layer, which is a dislocation generating layer made of a material different from said substrate, is formed between said substrate and said active layer,
wherein said dislocation generating layer generates one or more dislocations which originate from said dislocation generating layer and proceed upward in said first conductive-type nitride semiconductor layer, from said dislocation generating layer, and at least a part of the one or more dislocations generated in said dislocation generating layer reach said active layer and are distributed in a light emitting region of said active layer and are located underneath said second conductive-type electrode in a region where said second conductive-type pad electrode is not formed.

2. The nitride semiconductor light emitting diode according to claim 1, wherein dislocations generated in the intermediate layer are uniformly distributed in a light emitting region of the active layer.

3. The nitride semiconductor light emitting diode according to claim 1, wherein an average dislocation density in the light emitting region of said active layer is more than $1 \times 10^8$ cm$^{-2}$.

4. The nitride semiconductor light emitting diode according to claim 1, wherein an average dislocation density is less than $1 \times 10^8$ cm$^{-2}$ on the lower side of said intermediate layer, and an average dislocation density is more than $1 \times 10^8$ cm$^{-2}$ on the upper side of said intermediate layer, in a cross section vertical to a principal surface of said substrate.

5. The nitride semiconductor light emitting diode according to claim 1, wherein a V-shaped pit is generated in said active layer due to dislocations generated from said intermediate layer.

6. The nitride semiconductor light emitting diode according to claim 1, wherein a shape of said intermediate layer in a cross section vertical to a principal surface of said substrate is an island shape.

7. The nitride semiconductor light emitting diode according to claim 1, wherein said intermediate layer is an amorphous or polycrystal layer.

8. The nitride semiconductor light emitting diode according to claim 1, wherein said intermediate layer is formed in said first conductive-type nitride semiconductor layer.

9. The nitride semiconductor light emitting diode according to claim 1, wherein the total film thickness of said first conductive-type nitride semiconductor layer, said active layer and said second conductive-type nitride semiconductor layer on the upper side of said intermediate layer is ⅔ or less of the total film thickness of said first conductive-type nitride semiconductor layer, said active layer and said second conductive-type nitride semiconductor layer.

10. The nitride semiconductor light emitting diode according to claim 1, wherein said intermediate layer is formed at a position that is closer to said active layer than said substrate in said first conductive-type nitride semiconductor layer.

11. The nitride semiconductor light emitting diode according to claim 1, wherein the film thickness of said first conductive-type nitride semiconductor layer on the upper side of said intermediate layer is ½ or less of the entire film thickness of said first conductive-type nitride semiconductor layer.

12. The nitride semiconductor light emitting diode according to claim 1, wherein an average film thickness of said intermediate layer is from 5 to 20 nm.

13. The nitride semiconductor light emitting diode according to claim 1, wherein said intermediate layer is made of a nitride semiconductor containing Al.

14. The nitride semiconductor light emitting diode according to claim 1, wherein a periodic projection or recess for varying a traveling direction of light emitted from said active layer is formed on the under surface of said substrate.

15. The nitride semiconductor light emitting diode according to claim 1, wherein a side surface of said substrate is an inclined surface inclined inwardly toward the lower side from the upper side of said substrate.

16. The nitride semiconductor light emitting diode according to claim 1, wherein a side surface and the under surface of said substrate continuously constitutes a hemispheric surface.

17. The nitride semiconductor light emitting diode according to claim 1, wherein a protective film is at least formed on the under surface of said substrate, and satisfies a relation of $t = A\lambda/(4n)$:

where the symbol "t" denotes a film thickness of said protective film, "λ" denotes an emission wavelength of said active layer, "n" denotes a refractive index of said protective film, and "A" denotes a natural number.

18. A light emitting device comprising the nitride semiconductor light emitting diode according to claim 1, and a wavelength conversion member that converts a part of light emitted from the nitride semiconductor light emitting diode into light having a different wavelength.

19. A nitride semiconductor light emitting diode comprising:

a substrate made of a nitride semiconductor, a first conductive-type nitride semiconductor layer formed on said substrate, an active layer made of a nitride semiconductor formed on said first conductive-type nitride semiconductor layer, a second conductive-type nitride semiconductor layer formed on said active layer, a second conductive-type electrode formed on said second conductive-type nitride semiconductor layer, and a second conductive-type pad electrode formed on a part of said second conductive-type electrode, wherein light is extracted from the under surface side of said substrate or from the upper surface side of said second conductive-type nitride semiconductor layer, and wherein an intermediate layer, which is a dislocation generating layer made of an amorphous or polycrystal nitride semiconductor, is formed between said substrate and said active layer, wherein said dislocation generating layer generates one or more dislocations which originate from said dislocation generating layer; and a shape of said intermediate layer in a cross section vertical to a principal surface of said substrate is an island shape, and wherein at least a part of the one or more dislocations are located underneath said second conductive-type electrode in a region where said second conductive-type pad electrode is not formed.

20. The nitride semiconductor light emitting diode according to claim 19, wherein said intermediate layer is formed in said first conductive-type nitride semiconductor layer.

21. The nitride semiconductor light emitting diode according to claim 19, wherein the total film thickness of said first conductive-type nitride semiconductor layer, said active layer and said second conductive-type nitride semiconductor layer on the upper side of said intermediate layer is ⅔ or less of the total film thickness of said first conductive-type nitride semiconductor layer, said active layer and said second conductive-type nitride semiconductor layer.

22. The nitride semiconductor light emitting diode according to claim 19, wherein said intermediate layer is formed at a position that is closer to said active layer than said substrate in said first conductive-type nitride semiconductor layer.

23. The nitride semiconductor light emitting diode according to claim 19, wherein the film thickness of said first conductive-type nitride semiconductor layer on the upper side of said intermediate layer is ½ or less of the entire film thickness of said first conductive-type nitride semiconductor layer.

24. The nitride semiconductor light emitting diode according to claim 19, wherein an average film thickness of said intermediate layer is from 5 to 20 nm.

25. The nitride semiconductor light emitting diode according to claim 19, wherein said intermediate layer is made of a nitride semiconductor containing Al.

26. The nitride semiconductor light emitting diode according to claim 19, wherein a periodic projection or recess for varying a traveling direction of light emitted from said active layer is formed on the under surface of said substrate.

27. The nitride semiconductor light emitting diode according to claim 19, wherein a side surface of said substrate is an inclined surface inclined inwardly toward the lower side from the upper side of said substrate.

28. The nitride semiconductor light emitting diode according to claim 19, wherein a side surface and the under surface of said substrate continuously constitutes a hemispheric surface.

29. The nitride semiconductor light emitting diode according to claim 19, wherein a protective film is at least formed on the under surface of said substrate, and satisfies a relation of $t=A\lambda/(4n)$:

where the symbol "t" denotes a film thickness of said protective film, "$\lambda$" denotes an emission wavelength of said active layer, "n" denotes a refractive index of said protective film, and "A" denotes a natural number.

30. A light emitting device comprising the nitride semiconductor light emitting diode according to claim 19, and a wavelength conversion member that converts a part of light emitted from the nitride semiconductor light emitting diode into light having a different wavelength.

31. The nitride semiconductor light emitting diode according to claim 1, wherein an average dislocation density in the light emitting region of said active layer is in the range of:

$1\times10^8$ cm$^{-2}$ to $5\times10^9$ cm$^{-2}$.

32. The nitride semiconductor light emitting diode according to claim 1, wherein an average height of the dislocation generating layer is 50 nm or less.

33. The nitride semiconductor light emitting diode according to claim 19, wherein an average dislocation density produced by said dislocation generating layer in the light emitting region of said active layer is in the range of:

$1\times10^8$ cm$^{-2}$ to $5\times10^9$ cm$^{-2}$.

34. The nitride semiconductor light emitting diode according to claim 19, wherein an average height of the island-shaped dislocation generating layer is 50 nm or less.

* * * * *